US012772892B2

(12) United States Patent
Dadvand

(10) Patent No.: US 12,772,892 B2
(45) Date of Patent: Oct. 20, 2026

(54) SILVER- AND GOLD-PLATED CONDUCTIVE MEMBERS

(71) Applicant: TEXAS INSTRUMENTS INCORPORATED, Dallas, TX (US)

(72) Inventor: Nazila Dadvand, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 234 days.

(21) Appl. No.: 17/682,351

(22) Filed: Feb. 28, 2022

(65) Prior Publication Data

US 2023/0275050 A1 Aug. 31, 2023

(51) Int. Cl.
*H10W 72/90* (2026.01)
*H10W 72/50* (2026.01)
*H10W 72/59* (2026.01)
*H10W 90/00* (2026.01)

(52) U.S. Cl.
CPC ........... *H10W 72/90* (2026.01); *H10W 72/50* (2026.01); *H10W 72/59* (2026.01); *H10W 72/923* (2026.01); *H10W 72/952* (2026.01); *H10W 90/755* (2026.01)

(58) Field of Classification Search
CPC ..... H01L 21/56; H01L 24/03; H01L 23/3107; H01L 24/05; H01L 24/48; H01L 24/49; H01L 24/29; H01L 24/27; H01L 2224/2745; H01L 2224/27825; H01L 2224/29016; H01L 2224/2908; H01L 2224/29147; H01L 2224/29155; H01L 2224/29166; H01L 2224/29184; H01L 2224/29639; H01L 2224/29644; H01L 2224/04042; H01L 2224/05147; H01L 2224/05155; H01L 2224/05166; H01L 2224/05184; H01L 2224/05639; H01L 2224/05644; H01L 2224/48175; H01L 2224/03462; H01L 2224/0347; H01L 2224/05023; H01L 2224/05084; H01L 2224/05561; H01L 2224/05568; H01L 2224/05573; H01L 2924/0132
See application file for complete search history.

(56) References Cited

U.S. PATENT DOCUMENTS

2002/0093096 A1 * 7/2002 Tago ........................ H01L 24/11 257/E23.021
2004/0089946 A1 * 5/2004 Wen ........................ H01L 24/11 257/737
2005/0103636 A1 * 5/2005 Cheng .................... C25D 5/022 257/E23.021

(Continued)

*Primary Examiner* — Teresa M. Arroyo
(74) *Attorney, Agent, or Firm* — Xiaotun Qiu; Charles F. Koch

(57) ABSTRACT

In some examples, a semiconductor package comprises a semiconductor die including a device side having a circuit formed therein and a conductive member coupled to the circuit and having multiple layers. The conductive member includes: a titanium tungsten layer coupled to the circuit; a copper seed layer coupled to the titanium tungsten layer; a copper layer coupled to the copper seed layer; a nickel tungsten layer coupled to the copper layer; and a plated layer coupled to the nickel tungsten layer. The semiconductor package includes a bond wire coupled to the plated layer; and a conductive terminal coupled to the bond wire and exposed to an exterior surface of the semiconductor package.

15 Claims, 25 Drawing Sheets

(56) References Cited

U.S. PATENT DOCUMENTS

| | | | | |
|---|---|---|---|---|
| 2005/0151268 | A1* | 7/2005 | Boyd | H01L 24/13 257/784 |
| 2007/0205520 | A1* | 9/2007 | Chou | H01L 24/12 257/E23.129 |
| 2007/0275503 | A1* | 11/2007 | Lin | H01L 24/85 438/106 |
| 2008/0038913 | A1* | 2/2008 | Farooq | H01L 24/03 438/612 |
| 2010/0181675 | A1* | 7/2010 | Reynoso | H01L 23/4952 257/E23.072 |
| 2010/0193949 | A1* | 8/2010 | Belanger | H01L 24/05 257/E23.021 |
| 2010/0200974 | A1* | 8/2010 | Weng | H01L 24/48 257/E23.116 |
| 2010/0213608 | A1* | 8/2010 | Lau | H01L 24/05 257/737 |
| 2014/0061928 | A1* | 3/2014 | Lin | H01L 24/00 257/762 |
| 2014/0264843 | A1* | 9/2014 | Lin | H10W 74/47 257/737 |
| 2019/0229054 | A1* | 7/2019 | Lu | H01L 23/49822 |
| 2019/0378632 | A1* | 12/2019 | Yang | C23C 18/165 |

* cited by examiner

SILVER- AND GOLD-PLATED CONDUCTIVE MEMBERS

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wirebonding technique, in which the device side of the semiconductor chip is oriented upward and is coupled to the conductive members using bond wires.

SUMMARY

In some examples, a semiconductor package comprises a semiconductor die including a device side having a circuit formed therein and a conductive member coupled to the circuit and having multiple layers. The conductive member includes: a titanium tungsten layer coupled to the circuit; a copper seed layer coupled to the titanium tungsten layer; a copper layer coupled to the copper seed layer; a nickel tungsten layer coupled to the copper layer; and a plated layer coupled to the nickel tungsten layer. The semiconductor package includes a bond wire coupled to the plated layer; and a conductive terminal coupled to the bond wire and exposed to an exterior surface of the semiconductor package.

In some examples, a method for manufacturing a semiconductor package comprises forming a conductive member by sputtering a titanium tungsten layer on a semiconductor wafer; sputtering a copper seed layer on the titanium tungsten layer; plating a copper layer on the copper seed layer; plating a nickel tungsten layer on the copper layer; and plating a top layer on the nickel tungsten layer, the top layer being either a silver layer or a gold layer. The method includes dicing the semiconductor wafer to produce a semiconductor die having the conductive member; coupling a bond wire to the top layer and to a conductive terminal; and covering the semiconductor die and the conductive member with a mold compound such that the conductive terminal is exposed to an exterior of the mold compound.

DETAILED DESCRIPTION

Figure 1A:
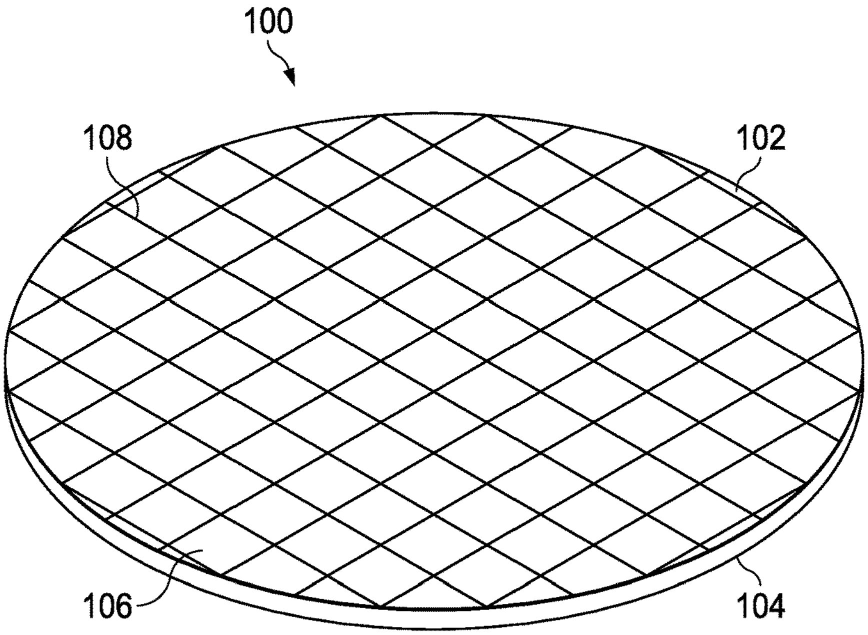
FIGS. 1A and 1B are perspective and top-down views, respectively, of a semiconductor wafer in accordance with various examples.

A semiconductor package may include a semiconductor die. The semiconductor die, in turn, may include a device side having a circuit that is formed in and/or on the device side. The circuit may perform a variety of actions. A conductive terminal (e.g., a lead or pin) of the package is coupled to the circuit by way of a bond wire. The bond wire may couple to the circuit using a bond pad. In some cases, the bond wire may be coupled to the circuit by way of a conductive member, such as a copper post. Because copper is vulnerable to oxidation, diffusion into adjacent structures composed of other metals, and other problems, specific non-copper metals are applied to the bottom of the conductive member (e.g., to prevent copper diffusion into the circuit) and to the top of the conductive member (e.g., to prevent oxidation and to prevent diffusion into other metals that may be located toward the top of the conductive member). One such metal that is frequently applied to the top of the conductive member is palladium. Palladium is typically applied to an intermediate layer (e.g., nickel) that is positioned between the palladium layer and the copper layer. The intermediate layer protects the palladium layer from copper diffusion. The palladium layer, in turn, protects the intermediate layer from oxidation, and it further provides a suitable surface for wirebonding. However, palladium presents multiple disadvantages. For instance, the presence of palladium during wirebonding or other applications of heat can cause galvanic corrosion of the conductive member, resulting in the formation of cavities in the wall of the conductive member. Such cavities compromise the electrical function of the conductive member, for example, by reducing the number of electrical contacts between the conductive member and the circuit in the semiconductor wafer and by reducing the current throughput ability of the conductive member. Palladium is also an expensive metal, and including palladium in volume package manufacturing substantially raises costs.

This disclosure describes various examples of a semiconductor package having a conductive member that replaces the intermediate (e.g., nickel) layer with a nickel tungsten layer. Even when thin, nickel tungsten is a highly effective diffusion barrier that mitigates copper diffusion into a top layer(s) of the conductive member and/or into a bond wire or ball coupled to the conductive member. Further, the conductive member described herein includes a top layer abutting the nickel tungsten layer. In some examples, the top layer is silver, and in other examples, the top layer is gold. Unlike nickel tungsten, which is unsuitably hard for wirebonding, both silver and gold are suitable for wirebonding and are also substantially less expensive than palladium. Thus, relative to a conductive member layer stack of nickel and palladium, a conductive member layer stack of nickel tungsten and silver or a conductive member layer stack of nickel tungsten and gold is thinner, substantially less expensive, and more effective at preventing copper diffusion.

Figure 1B:
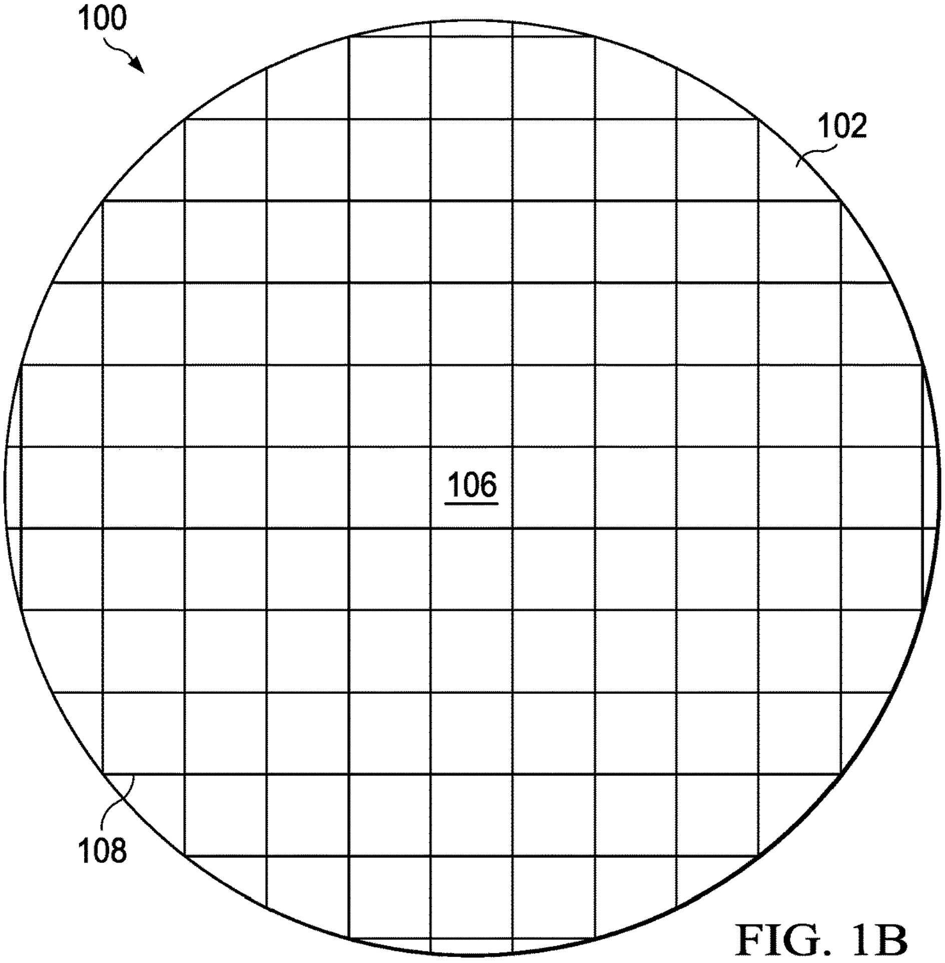
Figure 13A:
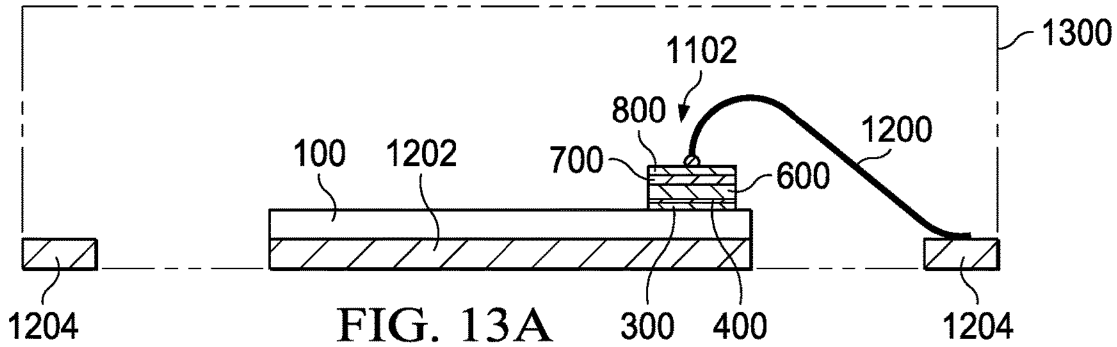
Figure 13B:
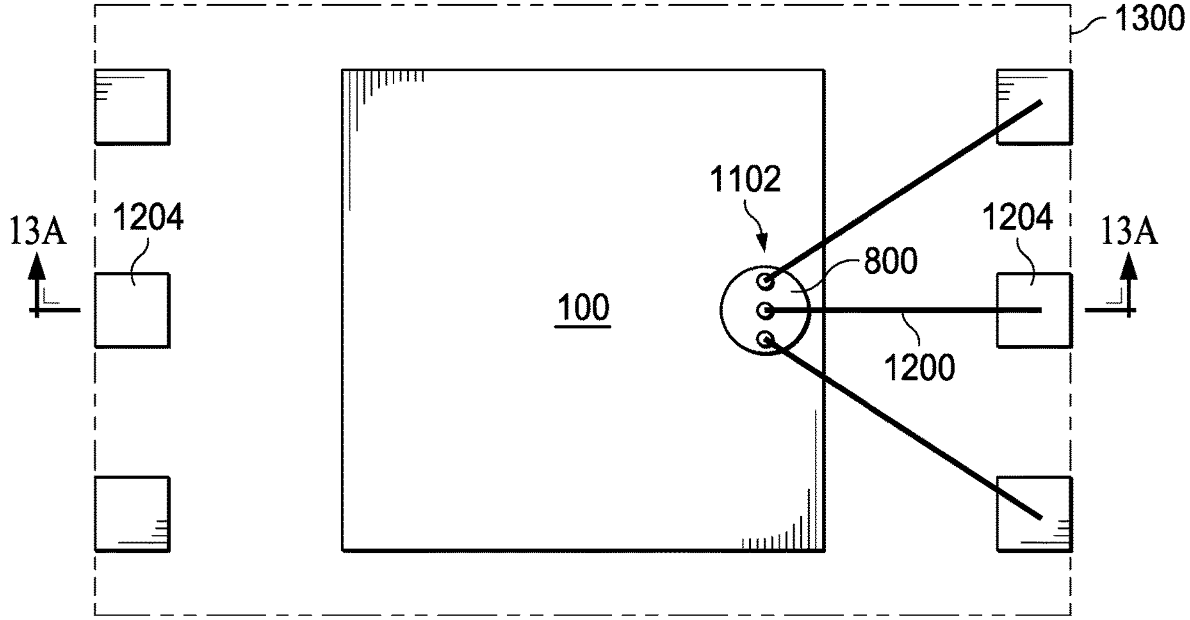
Figure 13C:
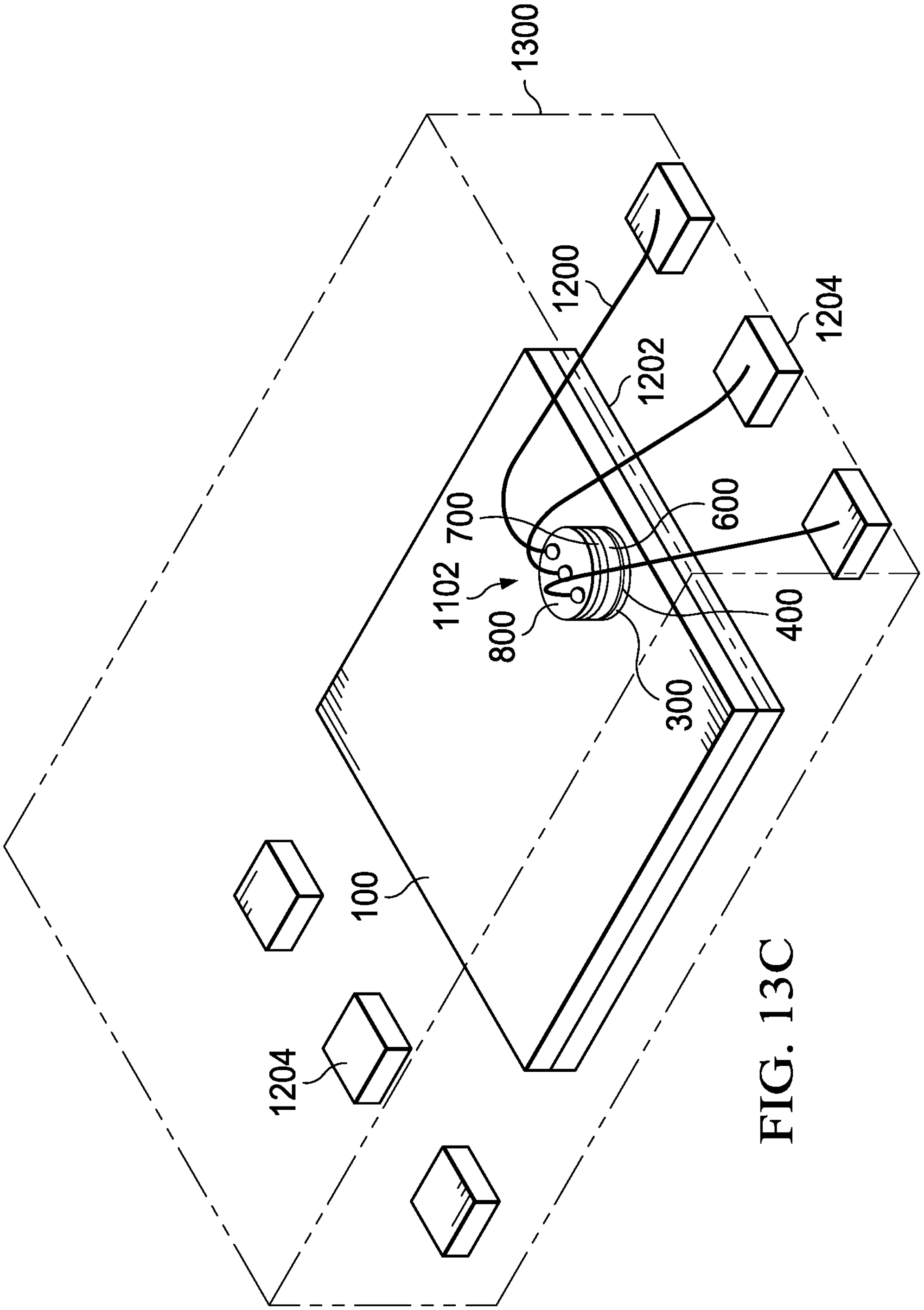
Figure 14:
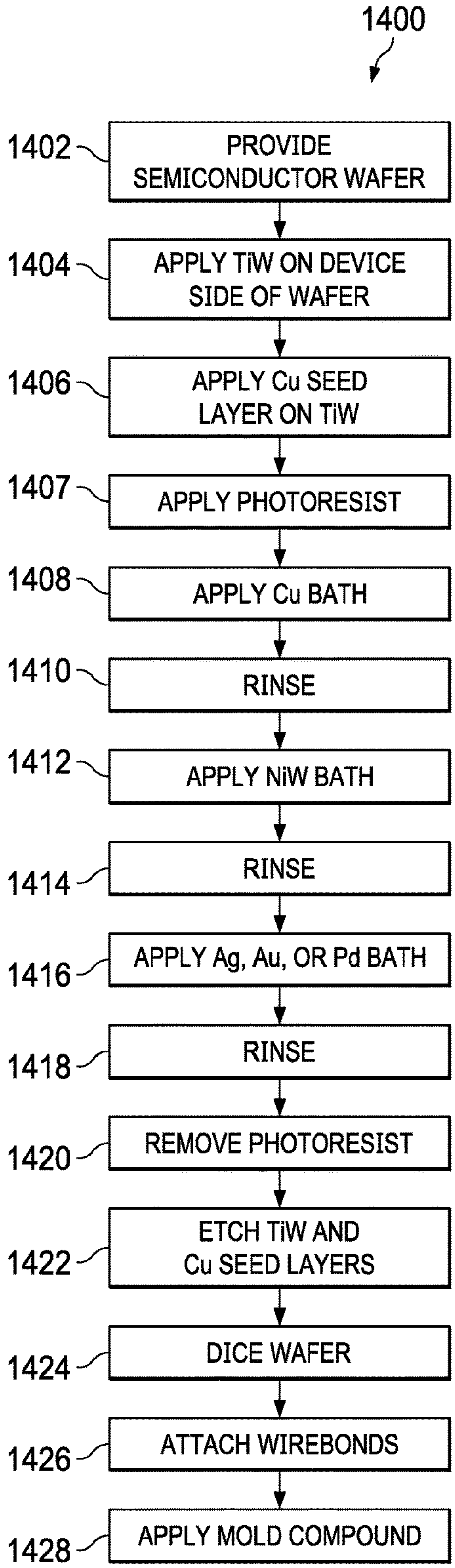
FIG. 14 is a flow diagram of a method for manufacturing a semiconductor package in accordance with various examples.

FIGS. 1A and 1B are perspective and top-down views, respectively, of a semiconductor wafer 100 in accordance with various examples. In particular, the wafer 100 may be composed of a semiconductor material such as silicon or gallium nitride, for example. The wafer 100 includes a device side 102 and a non-device side 104 opposite the device side 102. Multiple circuits 106 are formed in and on the device side 102. The non-device side 104 may also be referred to as a wafer backside. Scribe streets 108 separate the circuits 106 from each other, forming a grid pattern on the device side 102. During the manufacturing process, one or more conductive members, such as the conductive members described herein, are formed on the circuits 106. The wafer 100 is later diced along the scribe streets 108 to produce individual semiconductor dies, with each semiconductor die having its own circuit 106, and each circuit 106 having one or more of the conductive members described herein. The conductive members are wirebonded to conductive terminals (e.g., leads), and the assembly is then covered with a mold compound to form a finished semiconductor package. The process by which the conductive members are formed on the various circuits 106 of the wafer 100 is depicted in FIGS. 2A-13C. FIG. 14 is a flow diagram of a method 1400 useful to manufacture a semiconductor package according to examples. Thus, the method 1400 is now described with reference to FIGS. 2A-13C.

Figure 2A:
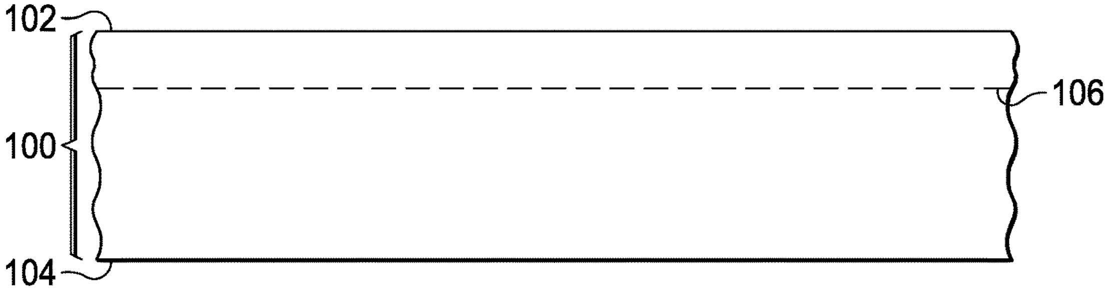
FIGS. 2A-13C are a process flow of a semiconductor package manufacturing process, in accordance with various examples.
Figure 2B:
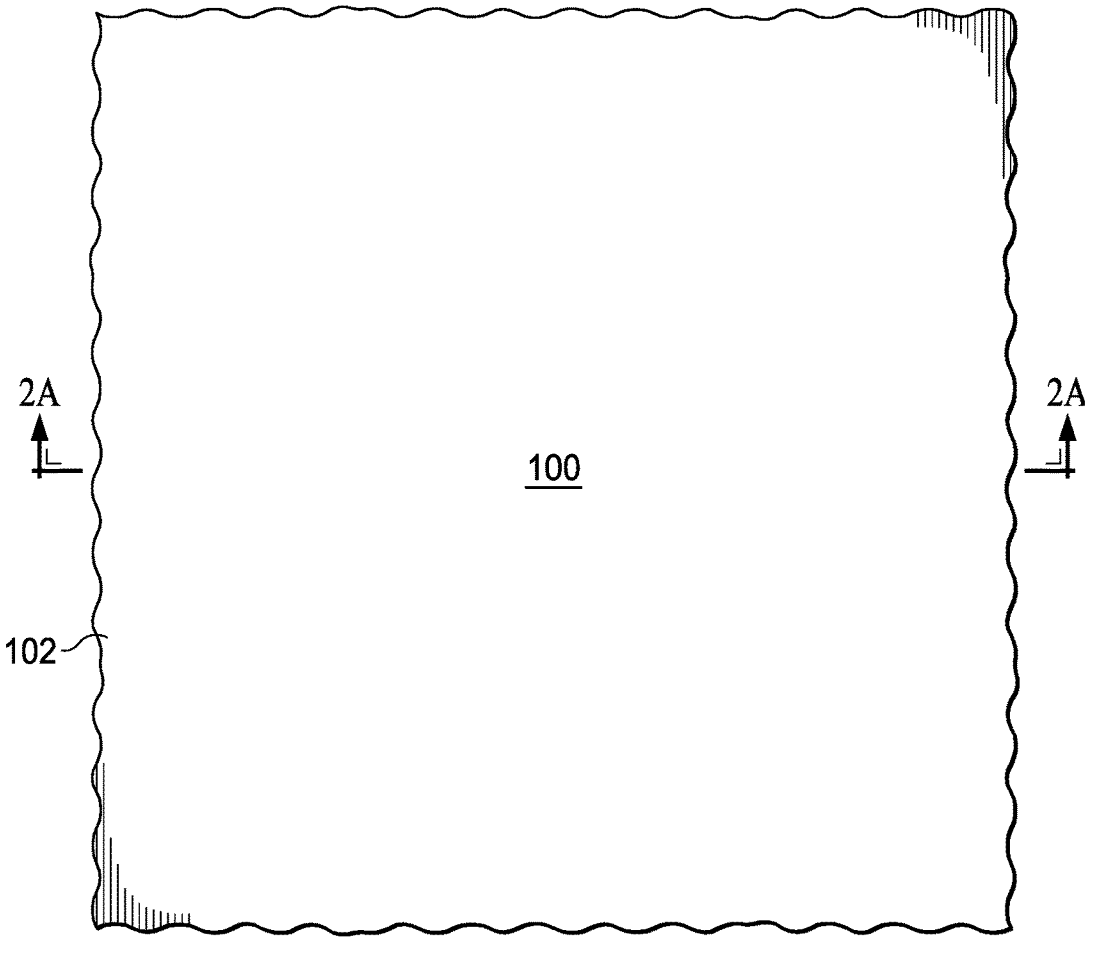
Figure 2C:
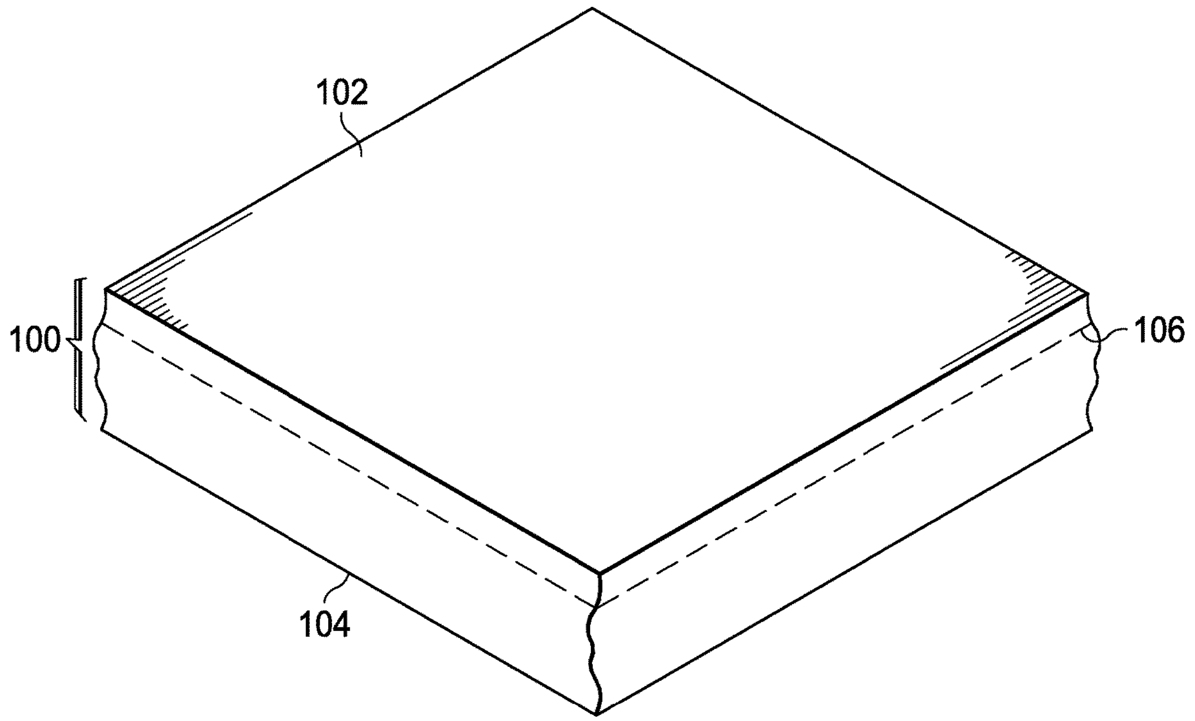

The method 1400 includes providing a semiconductor wafer (1402). FIG. 2A is a profile cross-sectional view that depicts a segment of the wafer 100 and a segment of a circuit 106 formed in and on the wafer 100. Although portions of a circuit 106 may extend slightly above the horizontal top surface of the device side 102 of the wafer 100, for clarity and ease of explanation, the drawings depict the circuit 106 being positioned fully within the wafer 100. FIG. 2B is a top-down view of the structure of FIG. 2A. FIG. 2C is a perspective view of the structure of FIG. 2A.

Figure 3A:
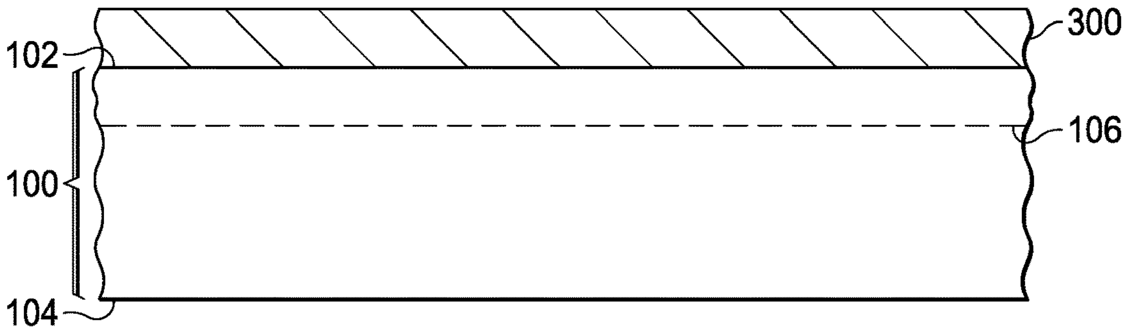
Figure 3B:
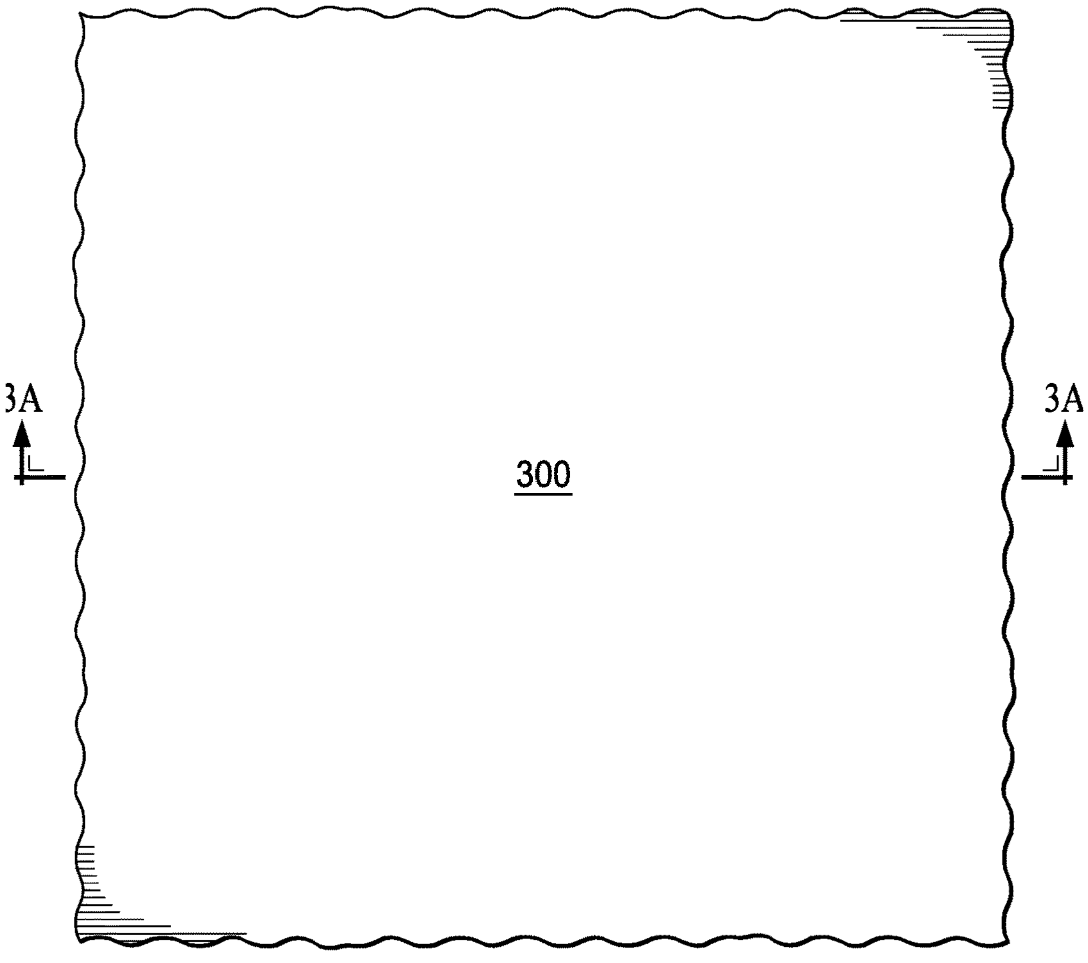
Figure 3C:
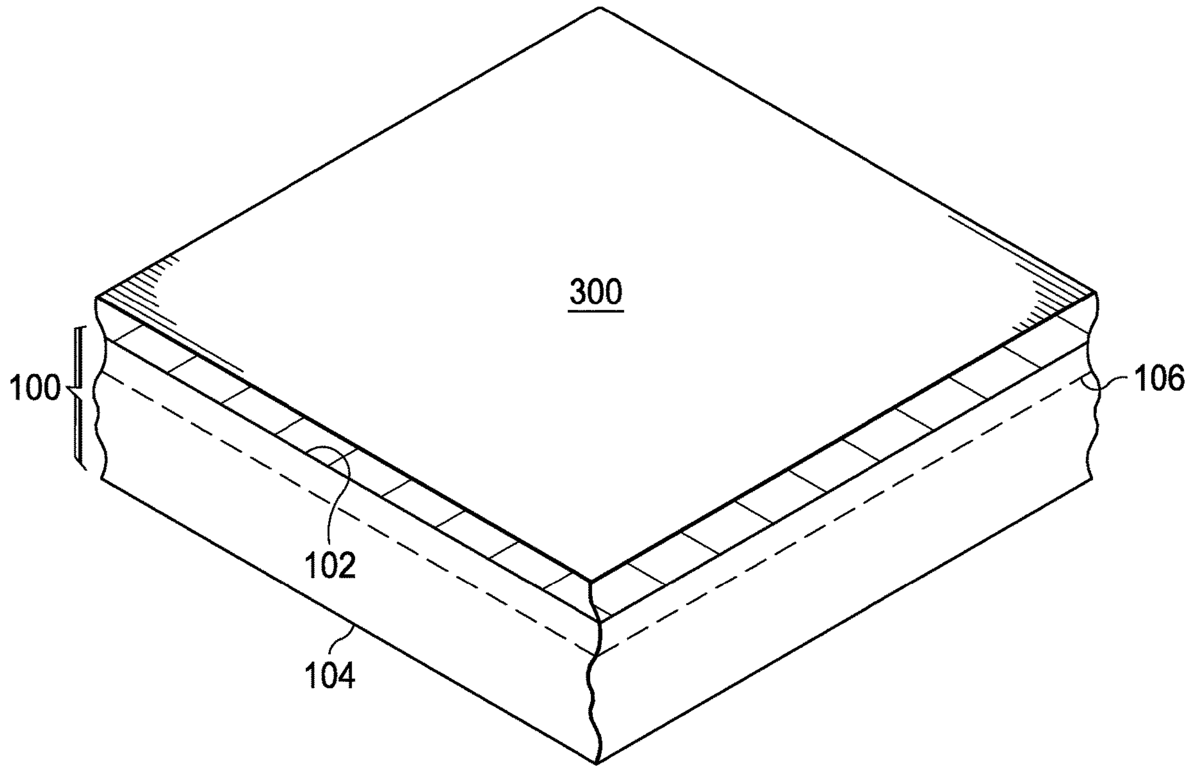

The method 1400 includes applying a TiW layer on a device side of the wafer (1404). FIG. 3A is an example profile cross-sectional view of the wafer 100 including the circuit 106, and a titanium tungsten (TiW) layer 300 above and abutting (making contact with) the top surface of the wafer 100. In examples, the TiW layer 300 abuts or is otherwise coupled to the circuit 106, for example through vias (not expressly shown) in the circuit 106 and/or in the semiconductor material of the wafer 100. Although TiW is used as an example, in other examples, other suitable material(s) may be used, so long as such material(s) effectively mitigate the diffusion of copper (Cu) from copper layers to be later positioned above the TiW layer 300, through the TiW layer 300, and into the wafer 100. The percentage composition by weight of titanium in the TiW layer 300 ranges from 1% to 20%, with a composition lower than this range being disadvantageous because it is chemically unstable, and with a composition above this range being disadvantageous because it loses its ability to act as a diffusion barrier. The percentage composition by weight of tungsten in the TiW layer 300 ranges no higher than 99%, with a composition above this range being disadvantageous because it is chemically unstable. The thickness of the TiW layer 300 ranges from 1000 Angstroms to 5000 Angstroms, with a thickness below this range being disadvantageous because it is less effective as a diffusion barrier, and with a thickness above this range being disadvantageous because it has a negative impact on mechanical properties (e.g., the mechanical integrity) of the resulting structure. In some examples, the thickness of the TiW layer 300 may be increased or decreased depending on the percentage composition by weight of tungsten to achieve the same efficacy in mitigating copper diffusion. Specifically, the thickness of the TiW layer 300 may be as low as 1000 Angstroms if the percentage composition by weight of tungsten is as high as 99%, and conversely, the thickness of the TiW layer 300 may be as high as 5000 Angstroms if the percentage composition by weight of tungsten is as low as 80%. In examples, the TiW layer 300 is applied through sputtering, although other techniques are contemplated. FIG. 3B is a top-down view of the structure of FIG. 3A. FIG. 3C is a perspective view of the structure of FIG. 3A.

Figure 4A:
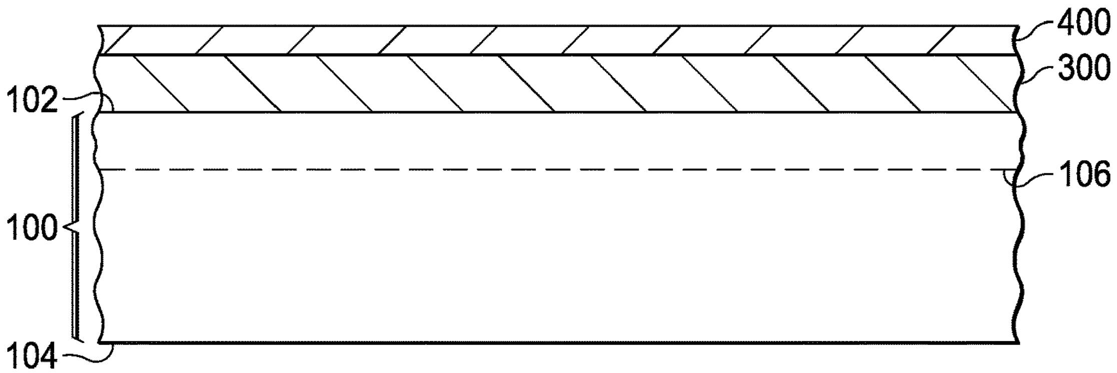
Figure 4B:
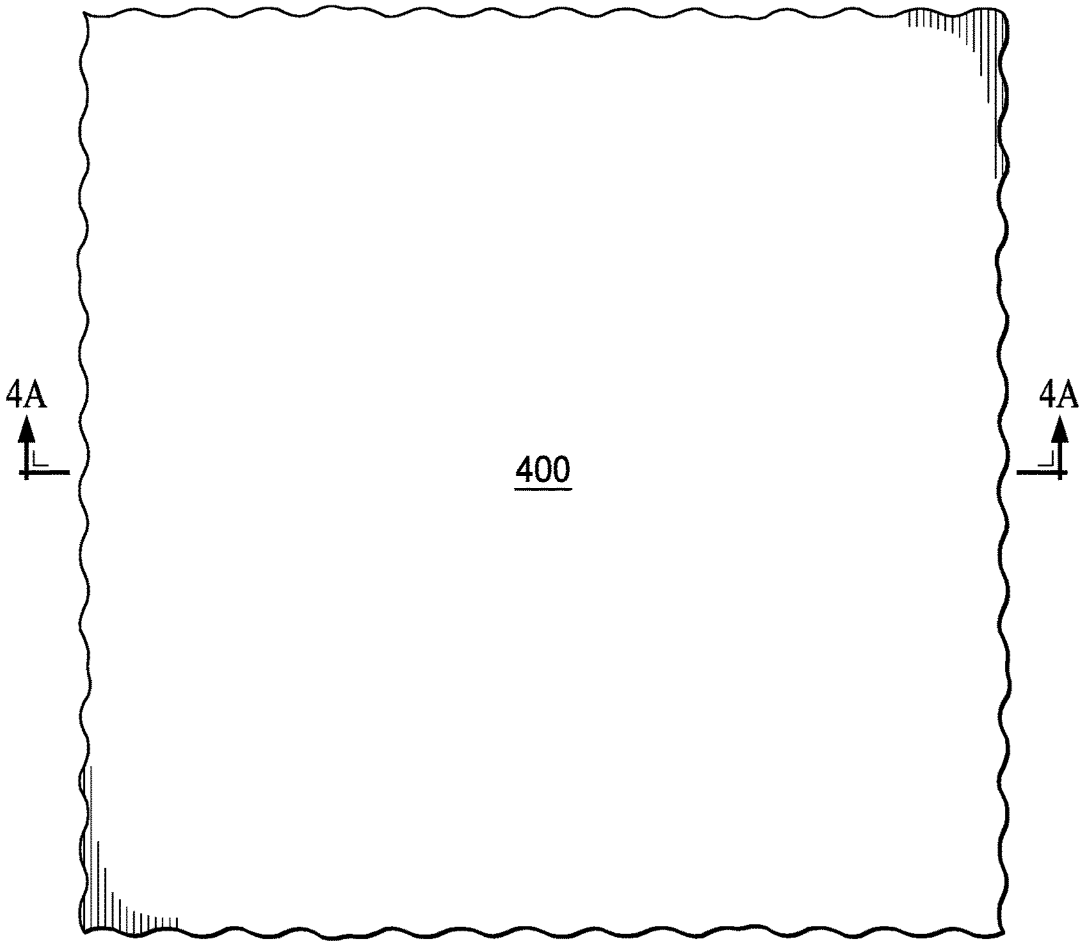
Figure 4C:
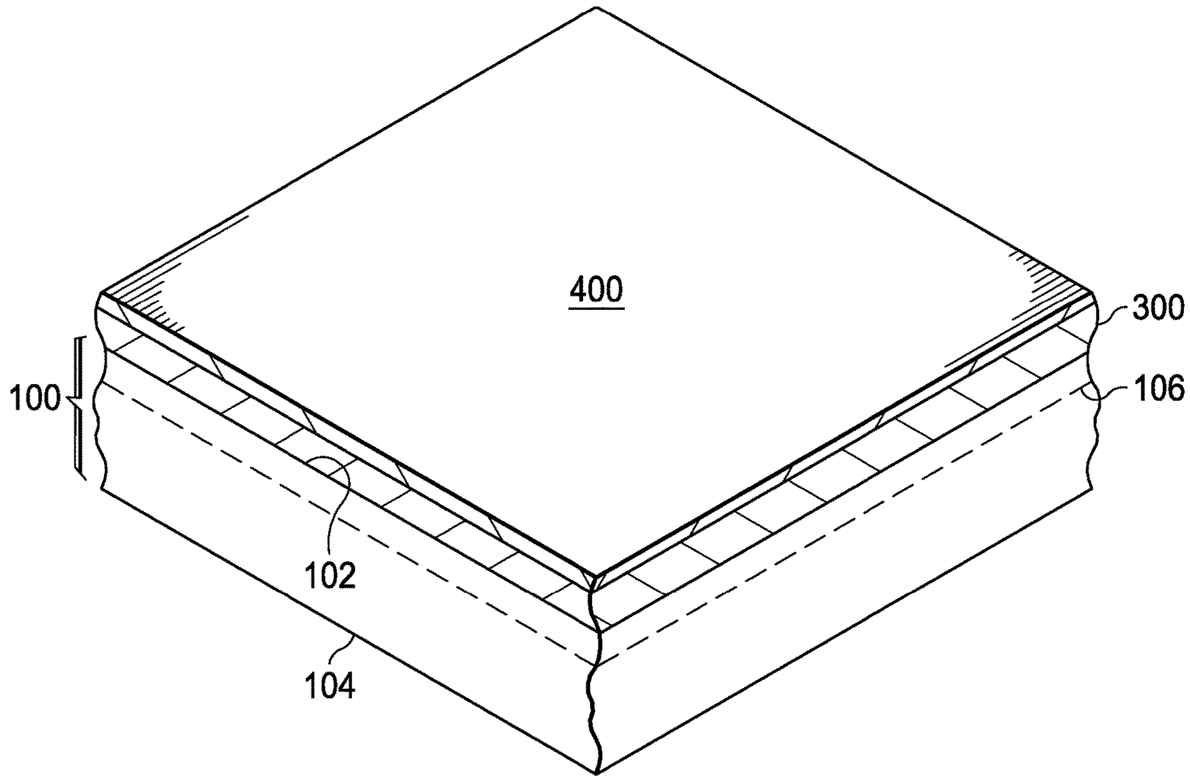

The method 1400 includes applying a copper seed layer on the TiW layer (1406). FIG. 4A is a profile cross-sectional view of the structure of FIGS. 3A-3C, but with the addition of a copper seed layer 400, in accordance with various examples. In examples, the copper seed layer 400 abuts or otherwise is coupled to the TiW layer 300. The thickness of the copper seed layer 400 ranges from 1000 Angstroms to 4000 Angstroms, with a thickness lower than this range being disadvantageous because of resulting poor conductivity properties, and with a thickness above this range being disadvantageous because of an unacceptably high cost. In examples, the copper seed layer 400 is applied through sputtering, although other application techniques are contemplated. FIG. 4B is a top-down view of the structure of FIG. 4A, and FIG. 4C is a perspective view of the structure of FIG. 4A.

Figure 5A:
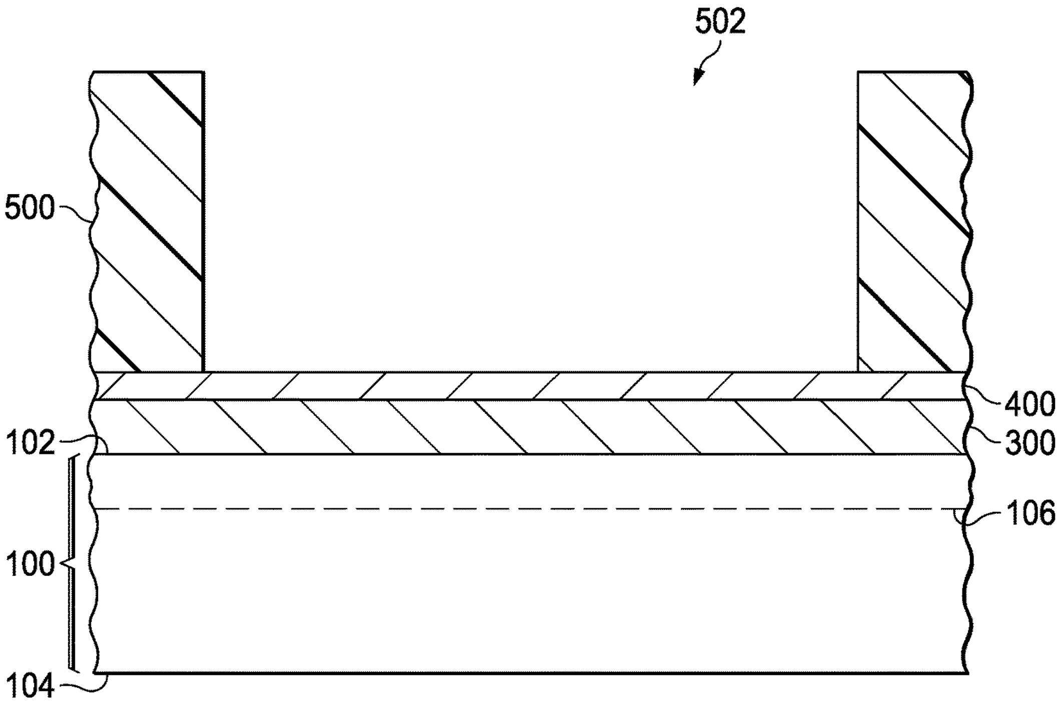
Figure 5B:
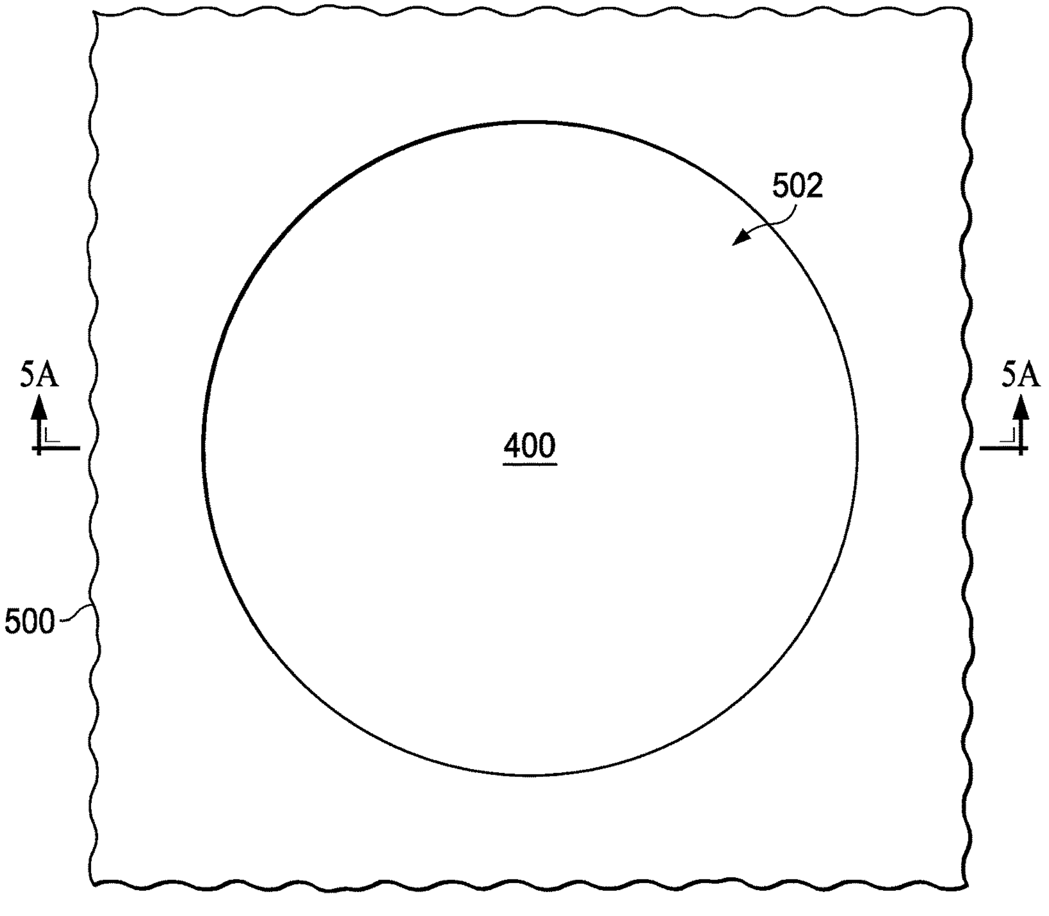
Figure 5C:
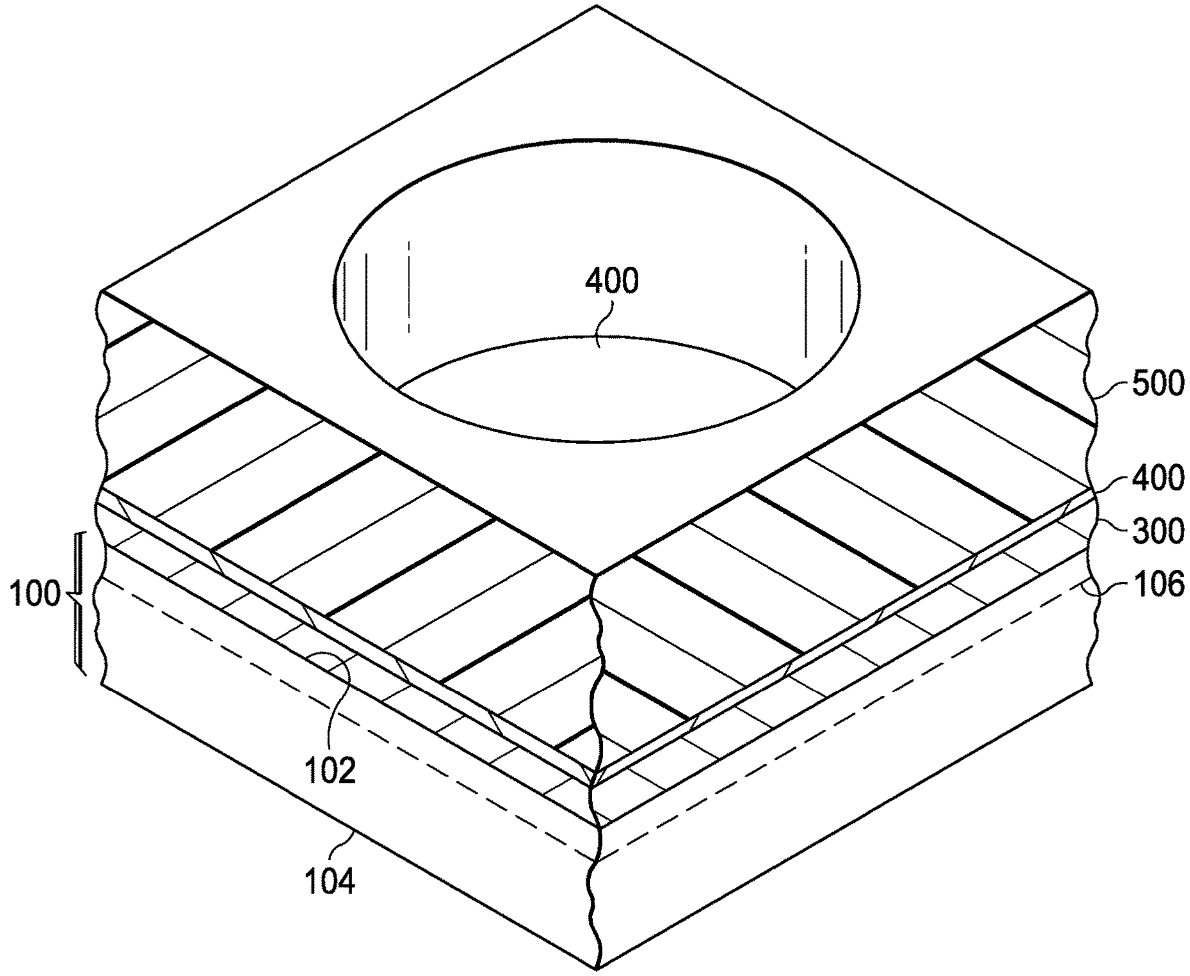

The method 1400 includes applying a photoresist to the copper seed layer (1407). FIG. 5A is a profile cross-sectional view of the structure of FIGS. 4A-4C, with the addition of a photoresist layer 500 having an orifice 502 therein, in accordance with various examples. The photoresist layer 500 may be of any suitable thickness, but it should be at least as thick as a target thickness of the conductive member that is being formed. The photoresist layer 500 may be formed using suitable photolithographic processes, for example, the formation and positioning of a mask above the photoresist layer 500 post-application to expose a target area of the photoresist layer 500 to light, the development of the photoresist layer 500 to remove the exposed area of the photoresist layer 500 to form the orifice 502, and so on. FIG. 5B is a top-down view of the structure of FIG. 5A. FIG. 5C is a perspective view of the structure of FIG. 5A.

Figure 6A:
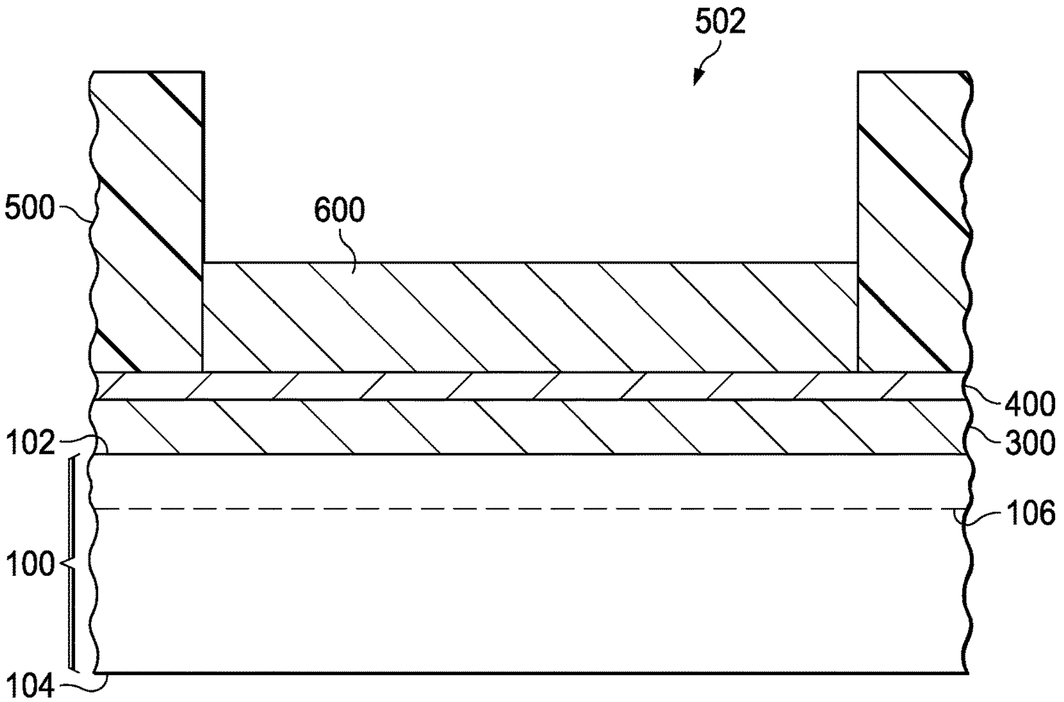
Figure 6B:
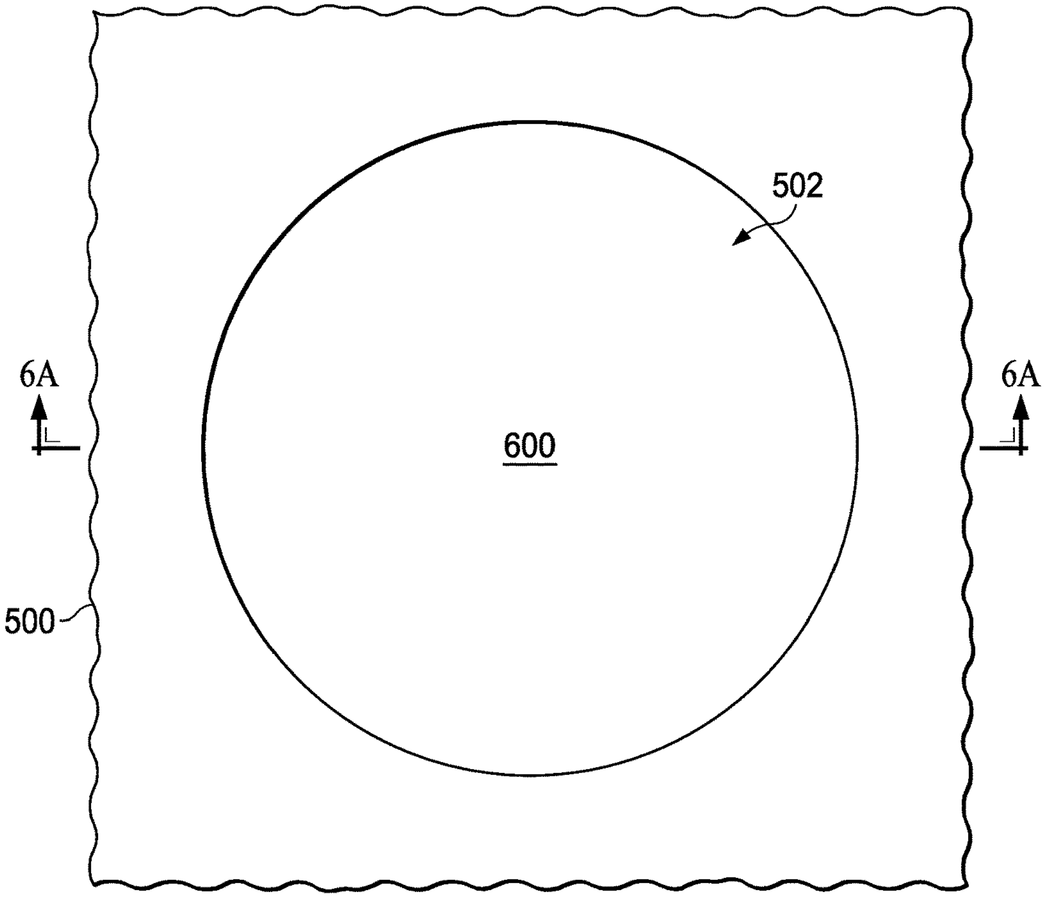
Figure 6C:
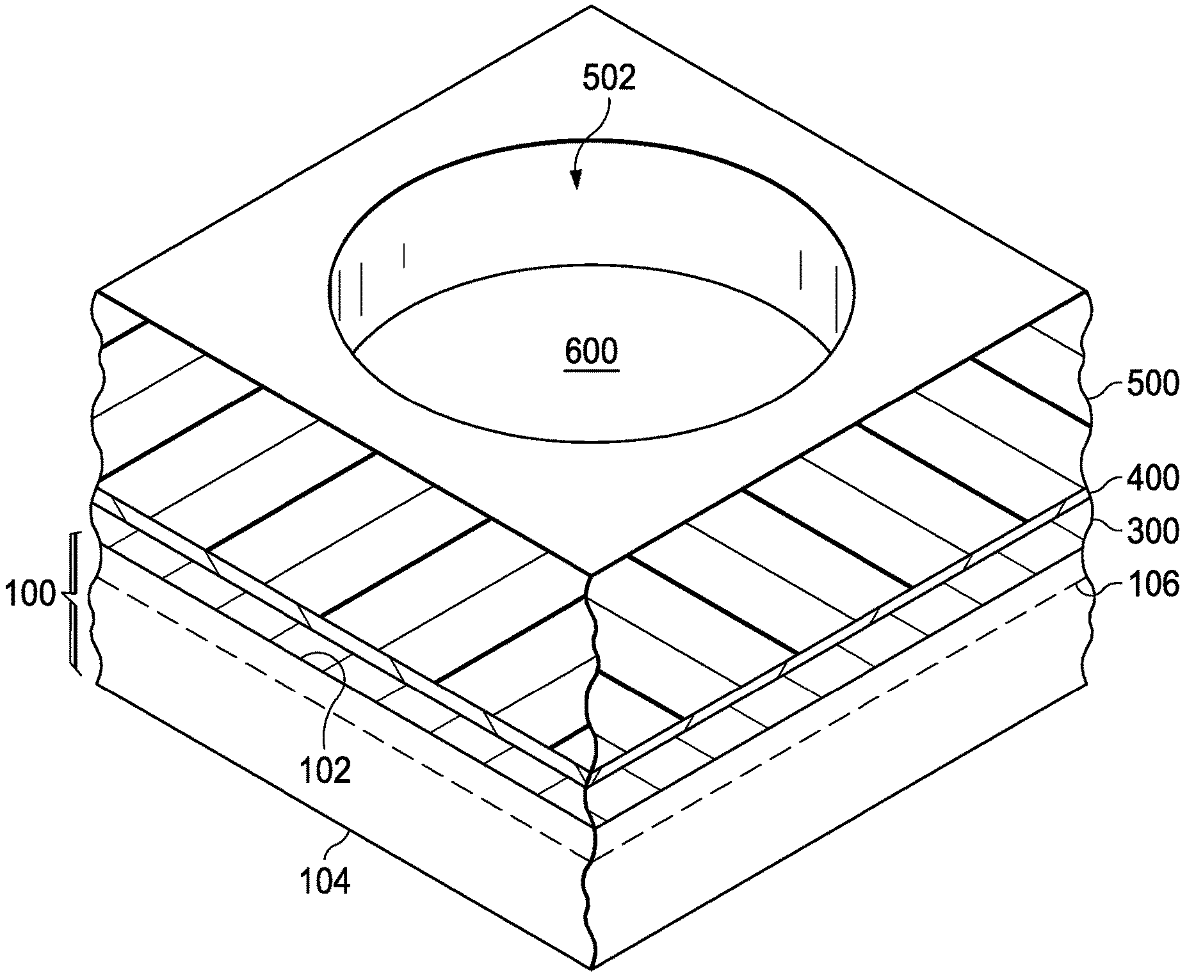

The method 1400 includes applying a copper electroplating bath (1408). FIG. 6A is a profile cross-sectional view of the structure of FIGS. 5A-5C, except with the addition of a copper layer 600. The copper layer 600 abuts the copper seed layer 400 and is formed within the orifice 502, as shown. The thickness of the copper layer 600 ranges from 0.1 microns to 4 microns, with a thickness below this range being disadvantageous because of the degree of resulting porosity and non-uniformity in the layer, and with a thickness above this range being disadvantageous because of a negative impact on mechanical properties (e.g. mechanical integrity) of the resulting structure. The method 1400 includes rinsing the resulting structure (1410). FIG. 6B is a top-down view of the structure of FIG. 6A. FIG. 6C is a perspective view of the structure of FIG. 6A.

Figure 7A:
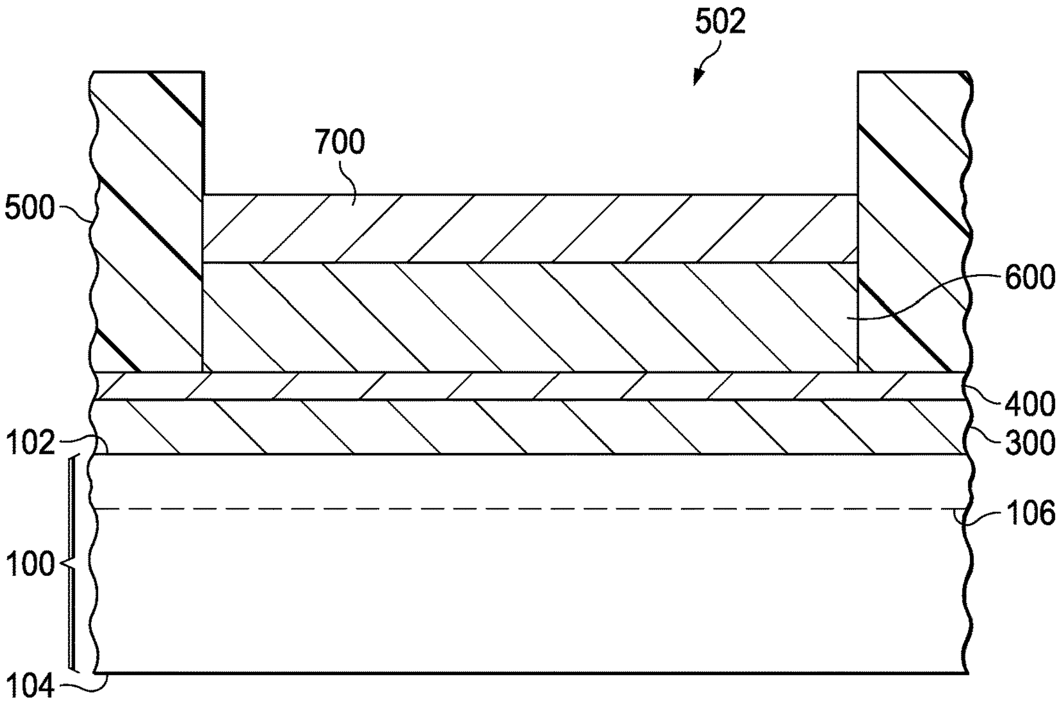
Figure 7B:
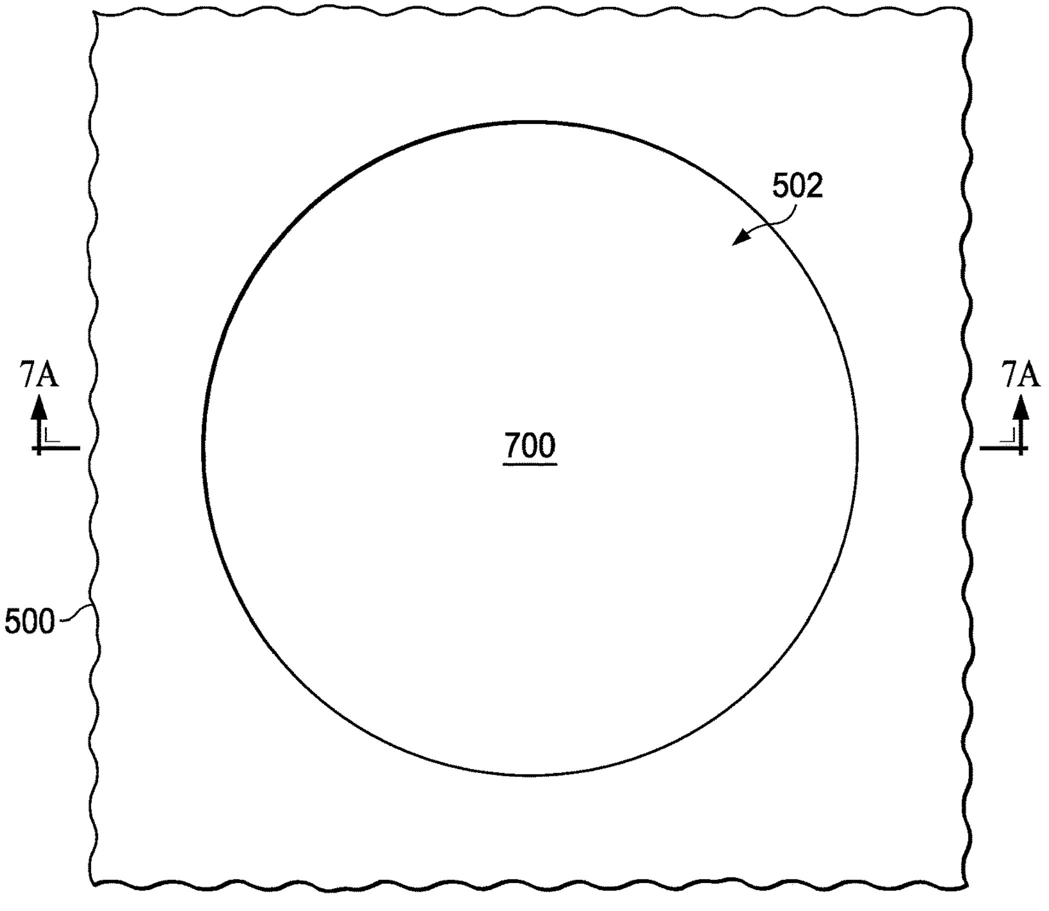
Figure 7C:
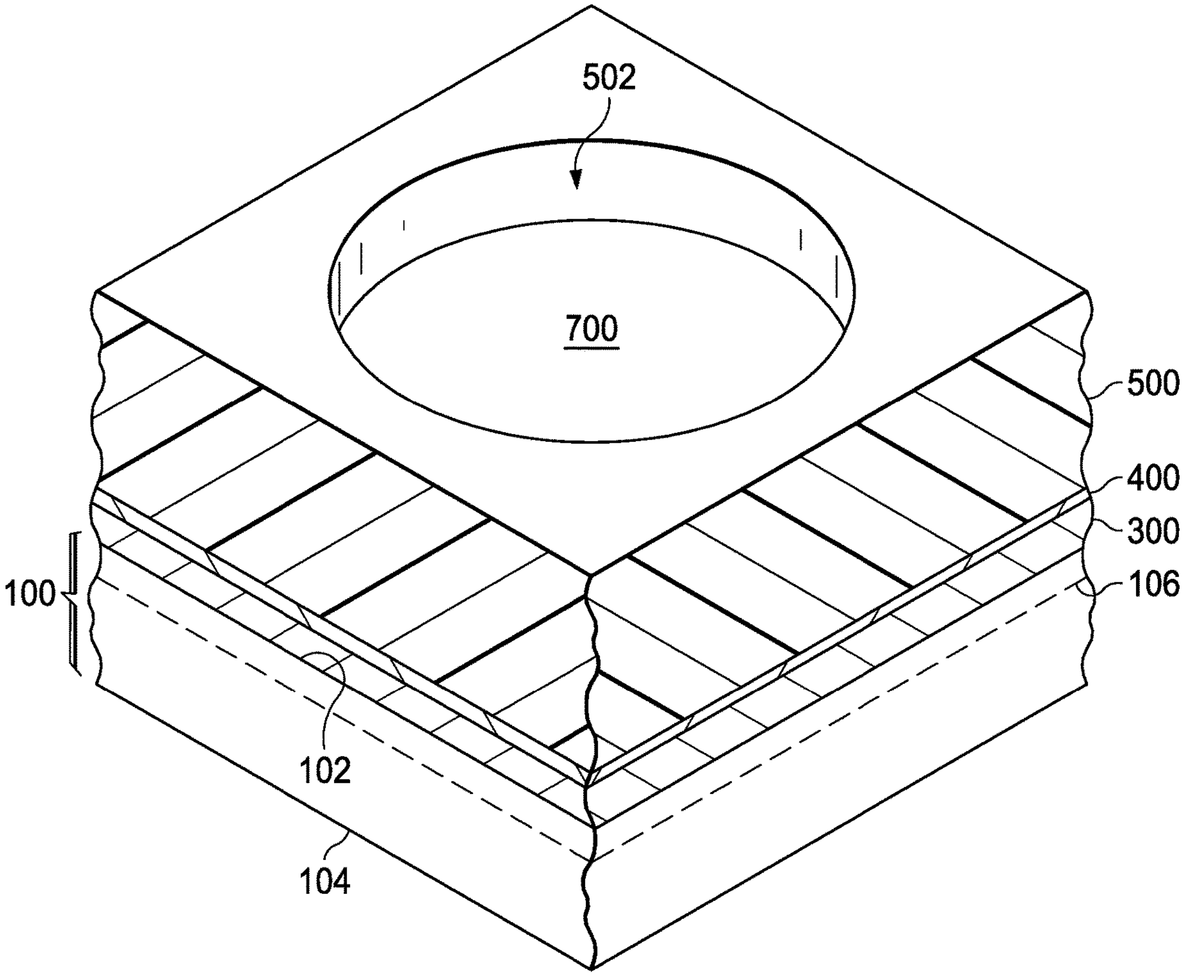

The method 1400 includes applying a nickel tungsten electroplating bath (1412). FIG. 7A is a profile cross-sectional view of the structure of FIGS. 6A-6C, except with the addition of a nickel tungsten (NiW) layer 700 in the orifice 502 and above and abutting the copper layer 600. The nickel tungsten layer 700 is highly effective in mitigating the diffusion of copper from the copper layer 600 to the next layer that is applied and abuts the top surface of the nickel tungsten layer 700. The percentage composition by weight of nickel in the NiW layer 700 ranges from 50% to 90%, with a composition lower than this range being disadvantageous because of poor reliability, and with a composition above this range being disadvantageous because of poor diffusion barrier properties. The percentage composition by weight of tungsten in the NiW layer 700 ranges from 10% to 50%, with a composition lower than this range being disadvantageous because of poor reliability, and with a composition above this range being disadvantageous because poor diffusion barrier properties. The thickness of the NiW layer 700 ranges from 0.5 microns to 1 micron, with a thickness below this range being disadvantageous because of poor diffusion barrier properties, and with a thickness above this range being disadvantageous because the structure will not pass on-board reliability tests, will experience warpage, and will not pass drop tests due to increased stress on the wafer 100. In some examples, the thickness of the NiW layer 700 may be increased or decreased depending on the percentage composition by weight of tungsten to achieve the same efficacy in mitigating copper diffusion. Specifically, the thickness of the NiW layer 700 may be as low as 0.1 micron if the percentage composition by weight of tungsten is as high as 50%, and conversely, the thickness of the NiW layer 700 may be as high as 3 microns if the percentage composition by weight of tungsten is as low as 10%. The structure is then rinsed (1414). FIG. 7B is a top-down view of the structure of FIG. 7A. FIG. 7C is a perspective view of the structure of FIG. 7A.

The NiW layer 700 provides strong structural integrity to a semiconductor package. Drop tests were conducted on semiconductor packages (e.g., wafer chip scale packages) having the NiW layer 700 in a conductive member formed on a semiconductor die therein. Thinner NiW layers produced stronger and more robust structures, with a NiW layer having a 1.5 micron thickness failing after 300 drop cycles, a NiW layer having a 1 micron thickness failing after 1500 drop cycles, and a NiW layer having a 0.5 micron thickness failing after 2000 drop cycles.

Figure 8A:
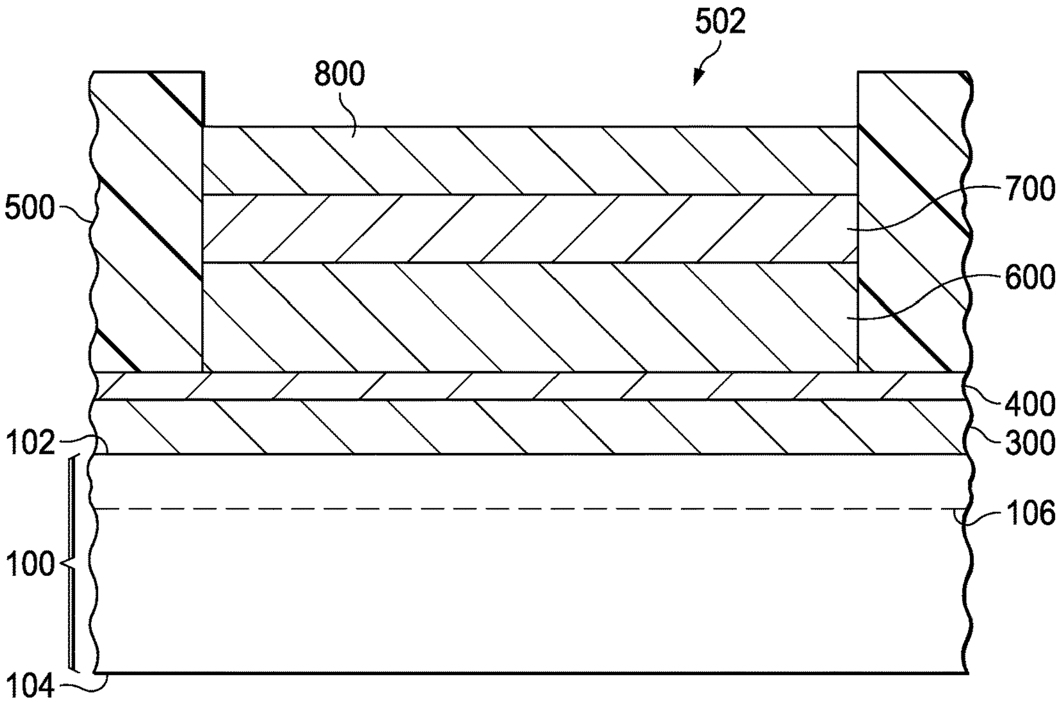

The method 1400 then comprises applying a top layer in a suitable electroplating bath (1416). FIG. 8A is a profile cross-sectional view of the structure of FIGS. 7A-7C, but with the addition of a top layer 800 above and abutting the NiW layer 700. In some examples, the top layer 800 is composed of silver. In some examples, the top layer 800 is composed of gold. In some examples, the top layer 800 is composed of palladium. The top layer 800 facilitates wirebonding because it is composed of a material that is less hard than the NiW layer 700. The top layer 800 also mitigates oxidation of the NiW layer 700.

In examples where the top layer 800 is composed of silver, the top layer 800 is formed using a silver electroplating bath, and it has a thickness ranging from 0.5 microns to 1 micron, with a thickness lower than this range being disadvantageous because an adequately strong wirebond cannot be formed on the top layer 800, and with a thickness greater than this range being disadvantageous because the top layer 800 is susceptible to delamination from the NiW layer 700.

In examples where the top layer 800 is composed of gold, the top layer 800 is formed using a gold electroplating bath, and it has a thickness ranging from 0.1 microns to 0.5 microns, with a thickness lower than this range being disadvantageous because poor porosity levels and high risk of wirebonding failure, and with a thickness greater than this range being disadvantageous because of unacceptably high costs.

In examples where the top layer 800 is composed of palladium, the top layer 800 is formed using a palladium electroplating bath, and it has a thickness no lower than 0.05 microns, with a thickness lower than this range being inadequate to mitigate oxidation or to facilitate wirebonding.

Figure 8B:
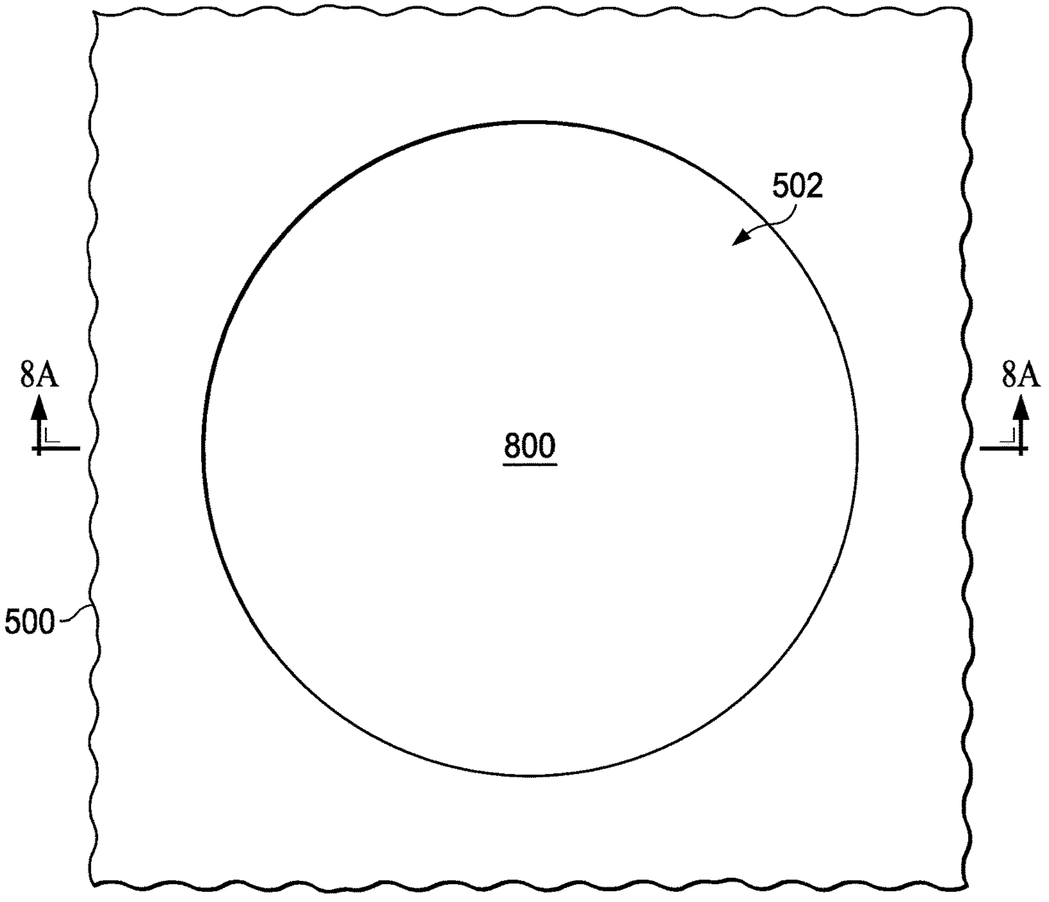
Figure 8C:
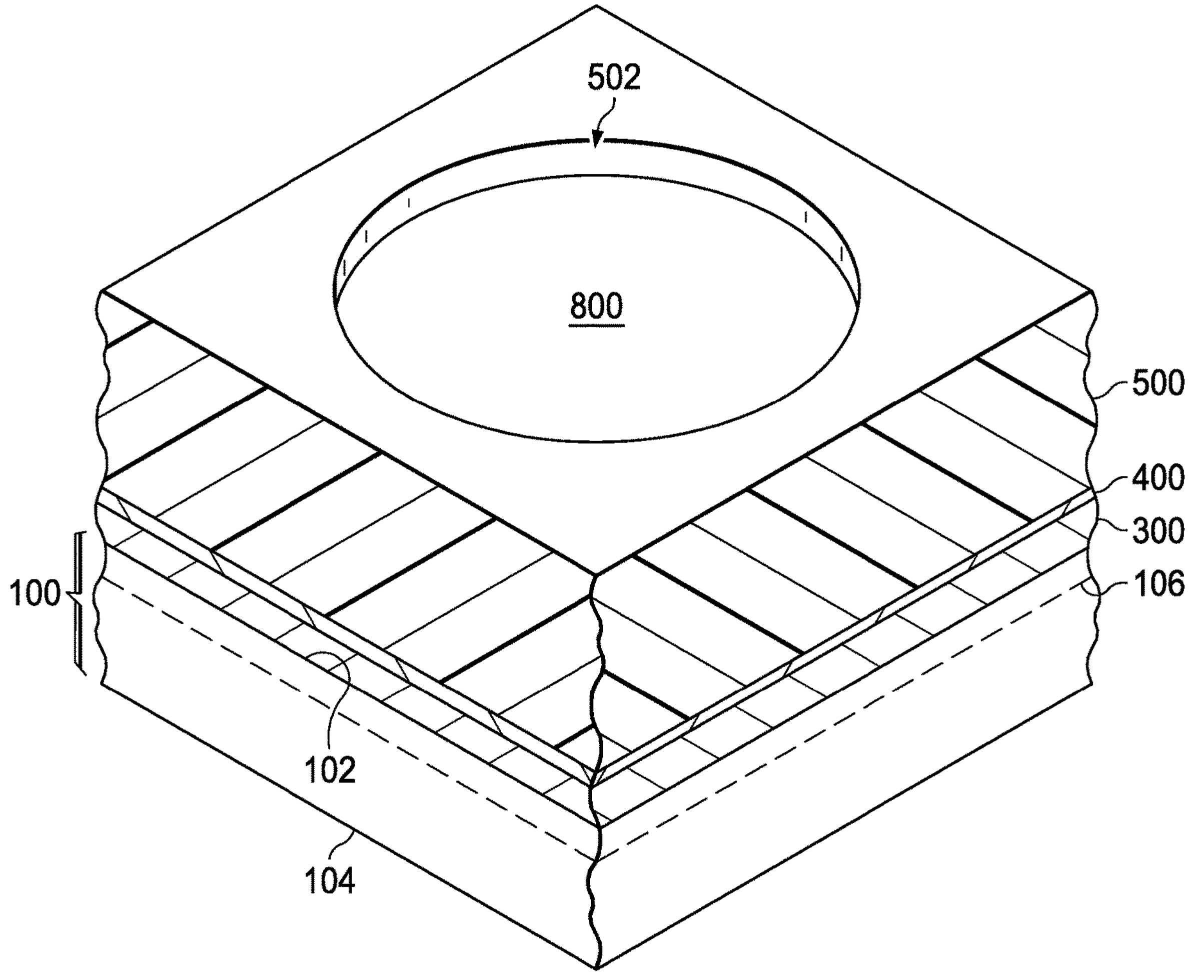

The structure is then rinsed (1418). FIG. 8B is a top-down view of the structure of FIG. 8A. FIG. 8C is a perspective view of the structure of FIG. 8A.

Figure 9A:
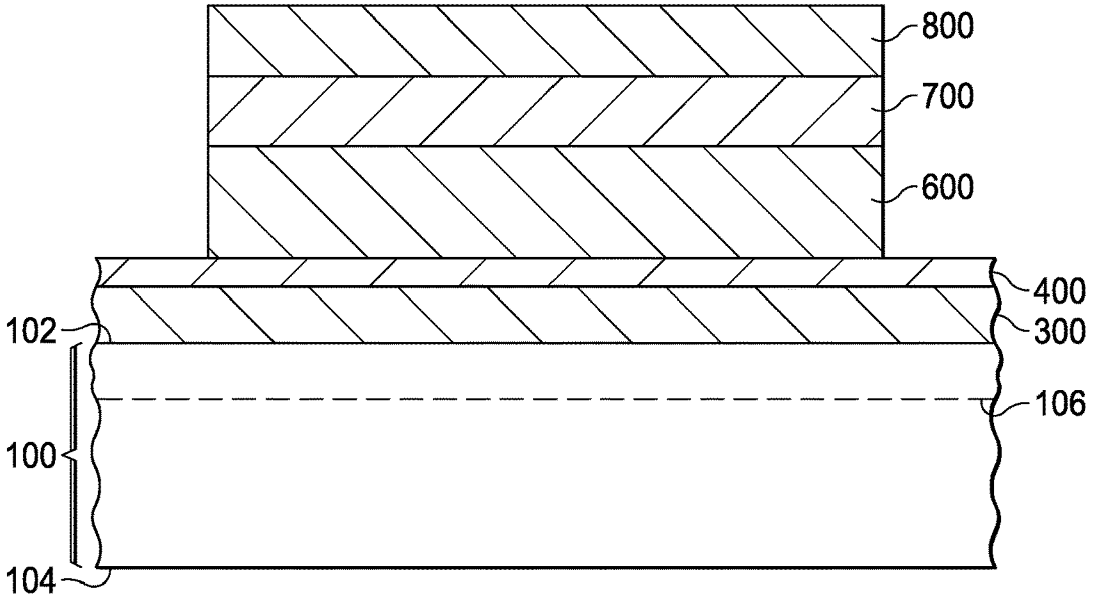
Figure 9B:
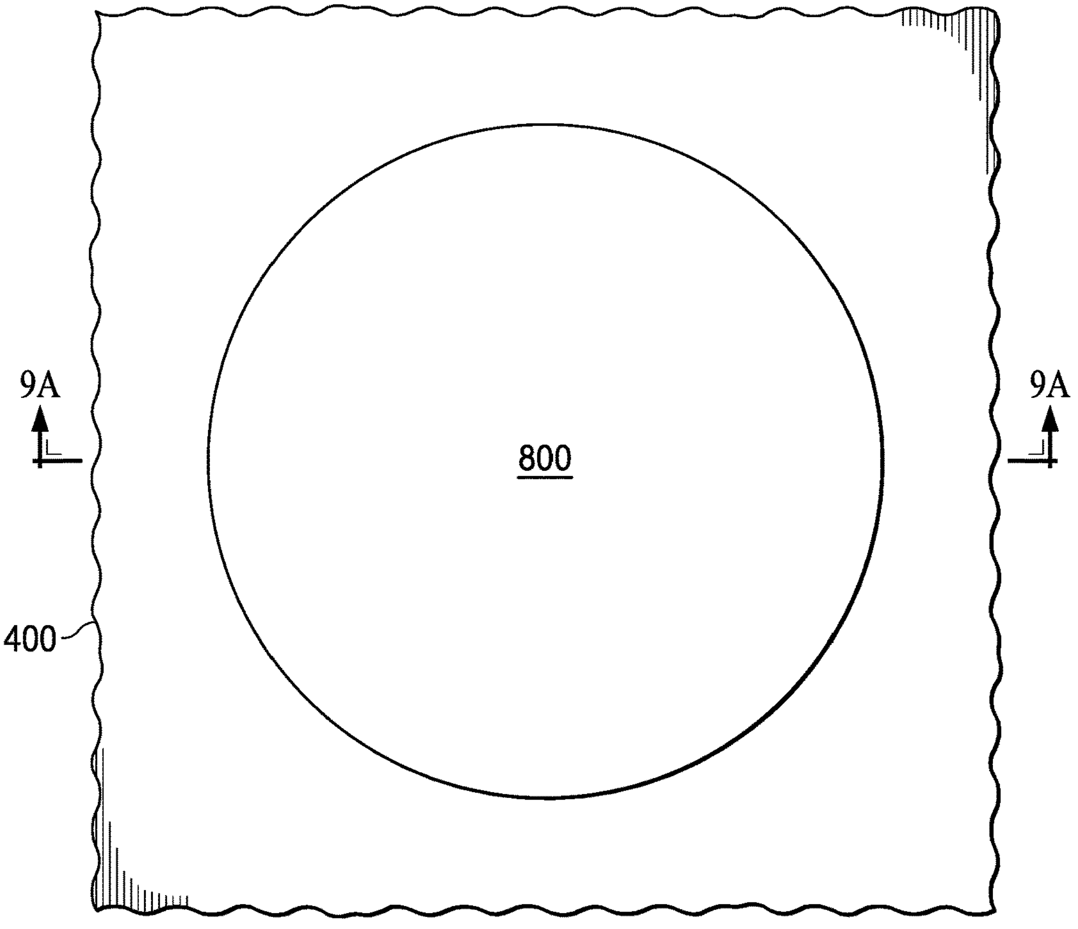
Figure 9C:
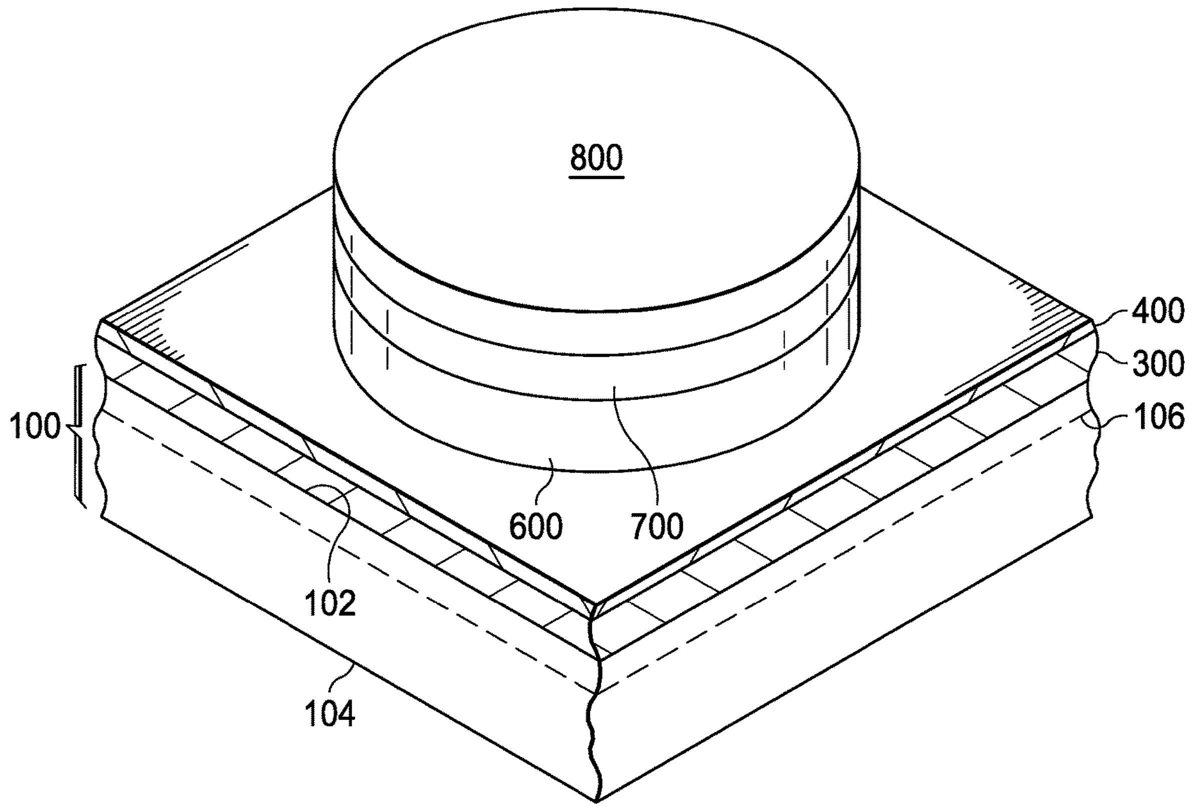

The method 1400 comprises removing the photoresist (1420). FIG. 9A is a profile cross-sectional view of the structure of FIGS. 8A-8C, but with the photoresist 500 removed. FIG. 9B is a top-down view of the structure of FIG. 9A. FIG. 9C is a perspective view of the structure of FIG. 9A.

Figure 10A:
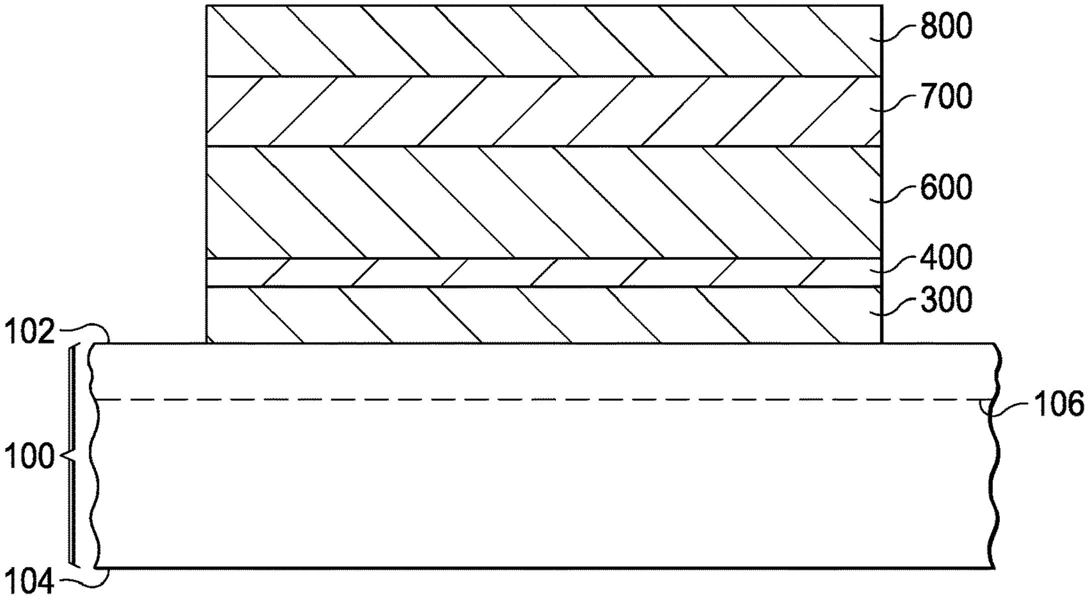
Figure 10B:
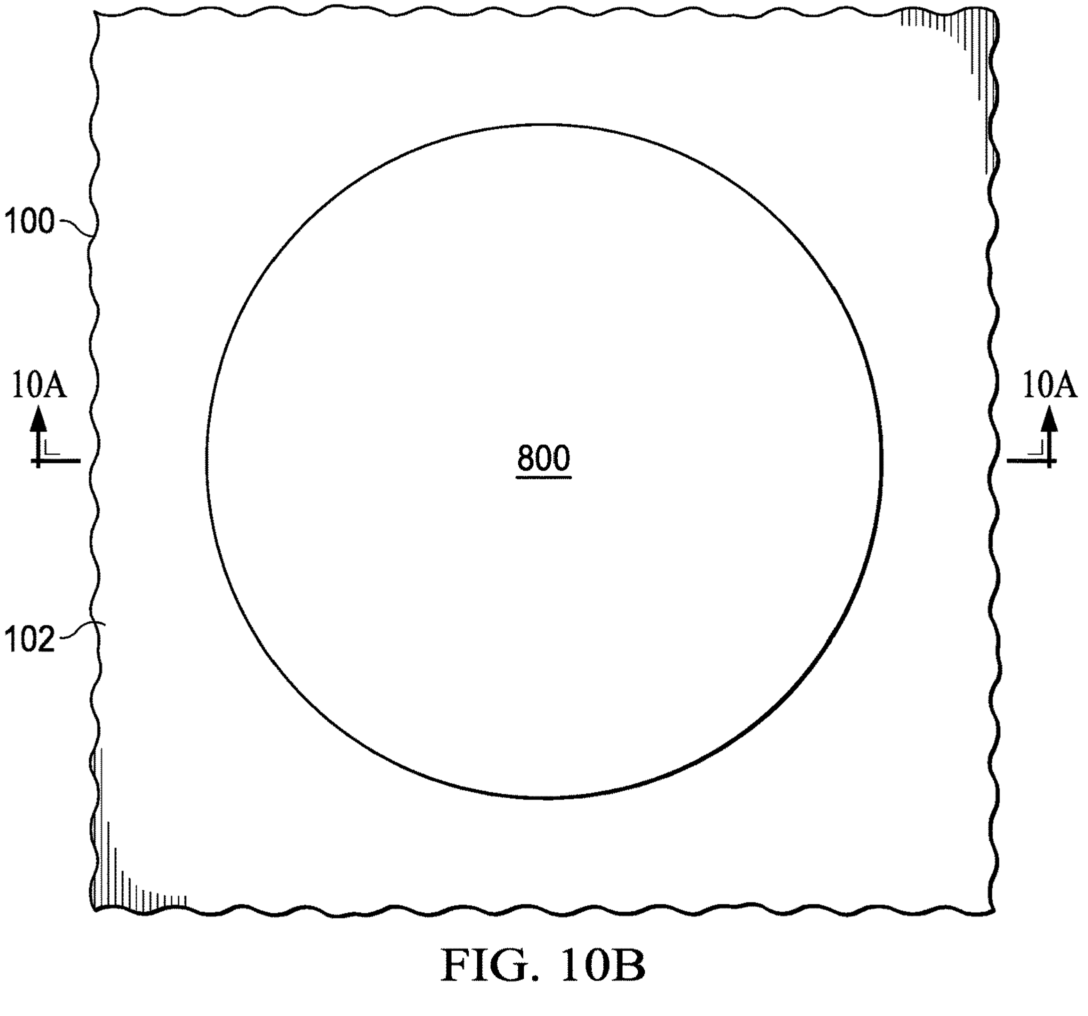
Figure 10C:
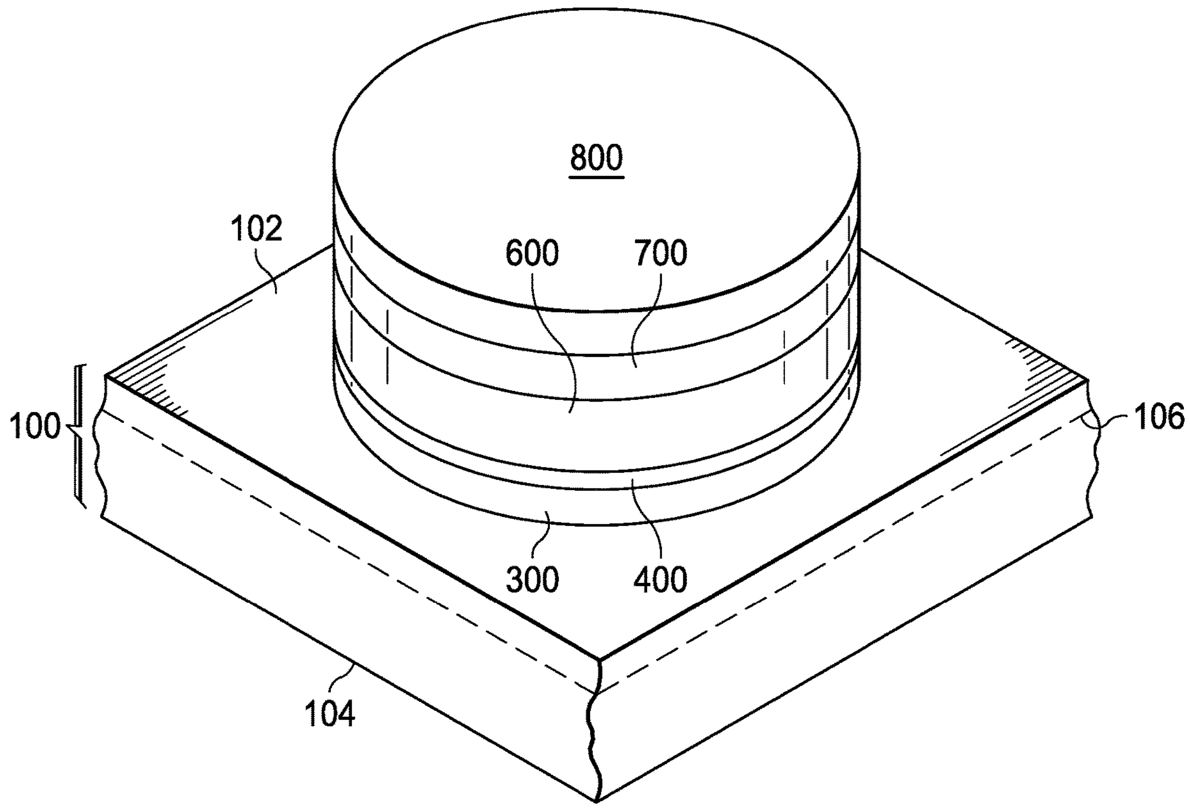

The method 1400 also includes etching away the portions of the copper seed layer 400 and the TiW layer 300 that are not positioned in vertical alignment with the layers 600, 700, and 800 (1422). FIG. 10A is a profile cross-sectional view of the structure of FIGS. 9A-9C, but with portions of the copper seed layer 400 and the TiW layer 300 etched away, as shown. FIG. 10B is a top-down view of the structure of FIG. 10A. FIG. 10C is a perspective view of the structure of FIG. 10A.

Figure 11A:
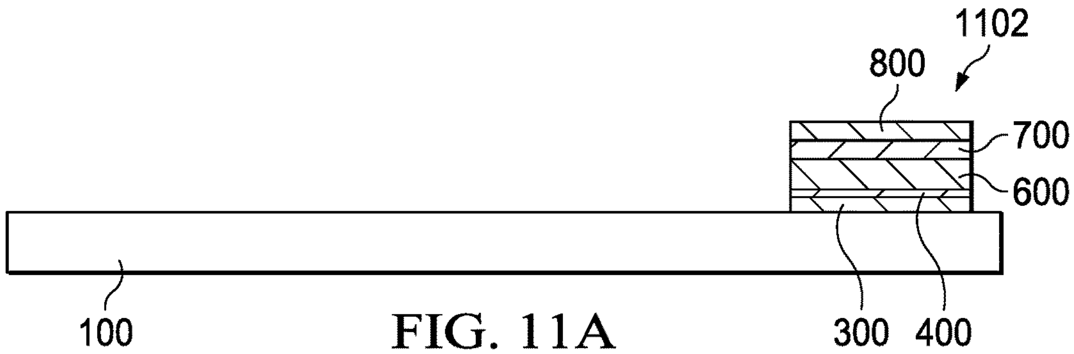
Figure 11B:
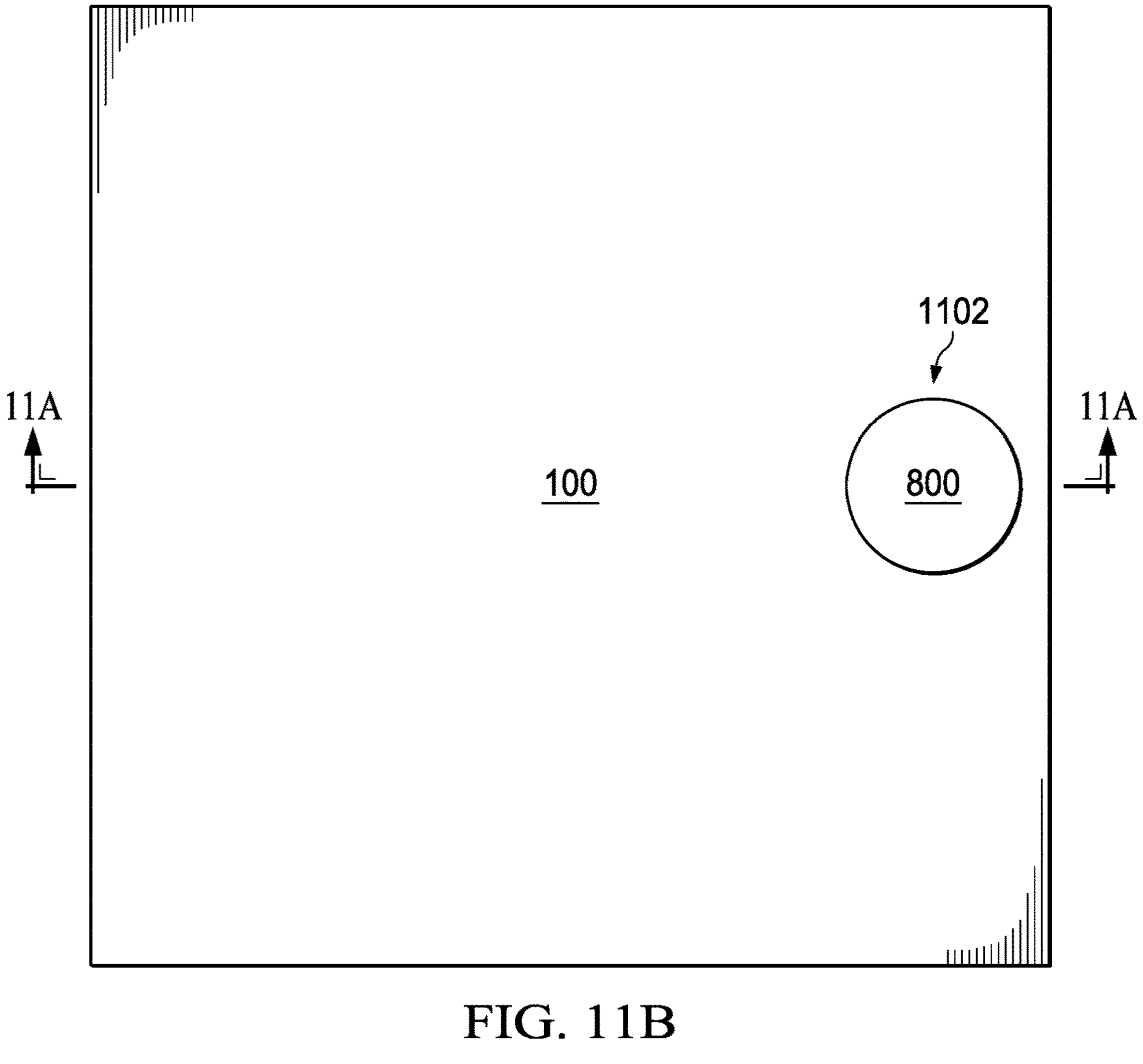
Figure 11C:
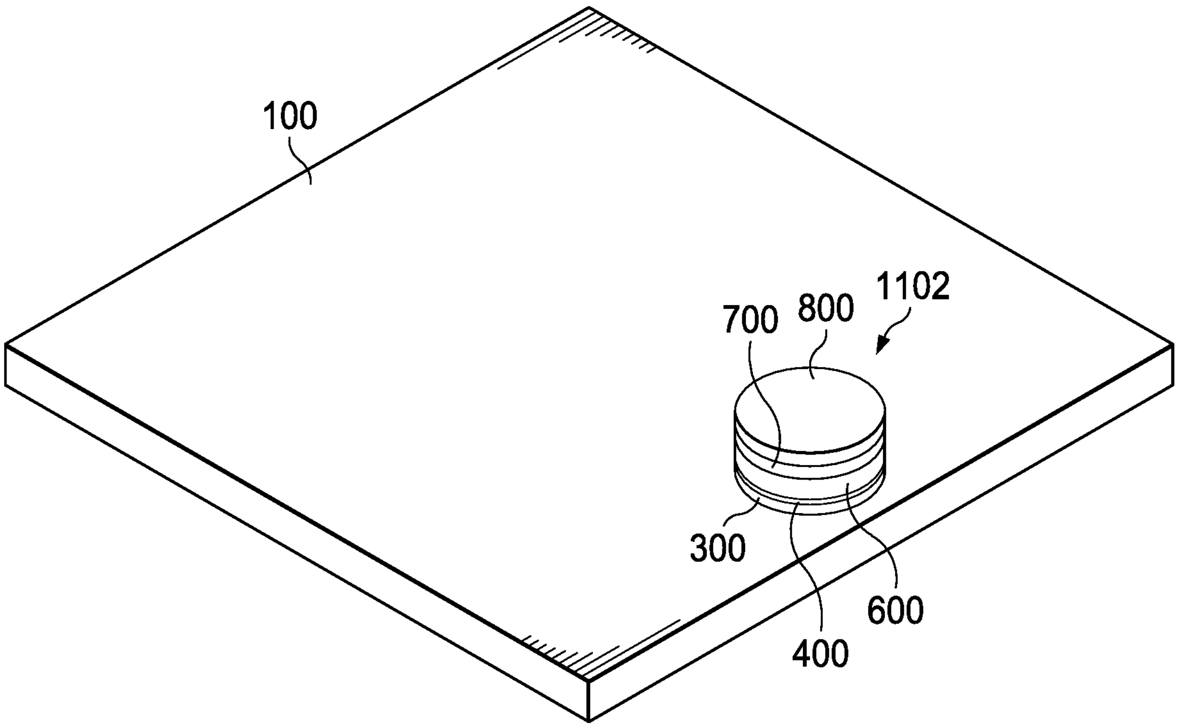

The method 1400 includes dicing the semiconductor wafer along the scribe streets (1424). FIG. 11A is a profile cross-sectional view of a semiconductor die 1100 having a conductive member 1102 coupled to a circuit (not expressly shown) formed in and/or on a device side of the semiconductor die 1100. The conductive member 1102 includes the layers 300, 400, 600, 700, and 800 described above. FIG. 11B is a top-down view of the structure of FIG. 11A. FIG. 11C is a perspective view of the structure of FIG. 11A. In some examples, such as when the top layer 800 is silver, gold, or another material besides palladium, and wherein palladium is absent from the conductive member 1102, the occurrence of the galvanic corrosion that accompanies semiconductor package manufacture in the presence of palladium is eliminated. Because galvanic corrosion is eliminated in such examples, gaps in the sidewalls of the conductive member that would otherwise be present due to galvanic corrosion are also eliminated. Stated another way, due to the absence of galvanic corrosion, the structural integrity of the conductive member 1102 is preserved, with the conductive member 1102 having a horizontal cross-sectional area that varies by less than 10%. Thus, the disadvantages accompanying the gaps caused by galvanic corrosion-a reduction in the number of electrical contacts between the conductive member and the circuit in the semiconductor wafer, and a reduction in the current throughput ability of the conductive member—are mitigated.

Figure 12A:
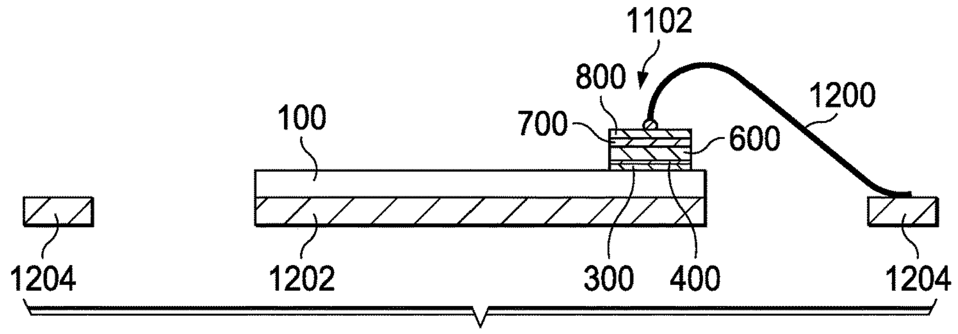
Figure 12B:
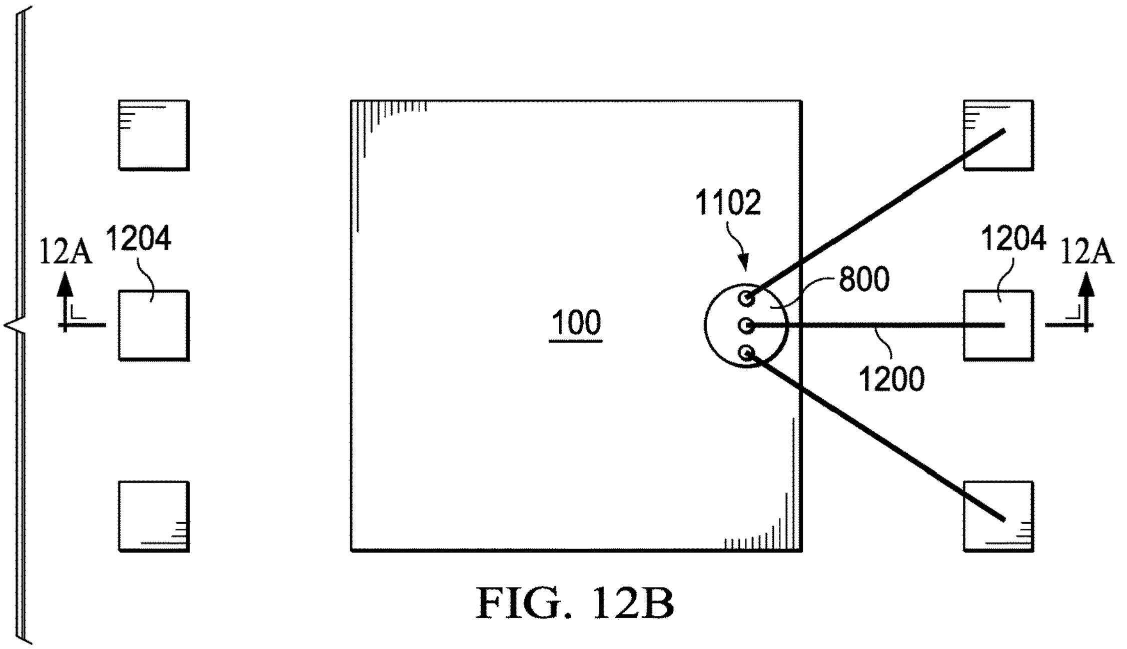
Figure 12C:
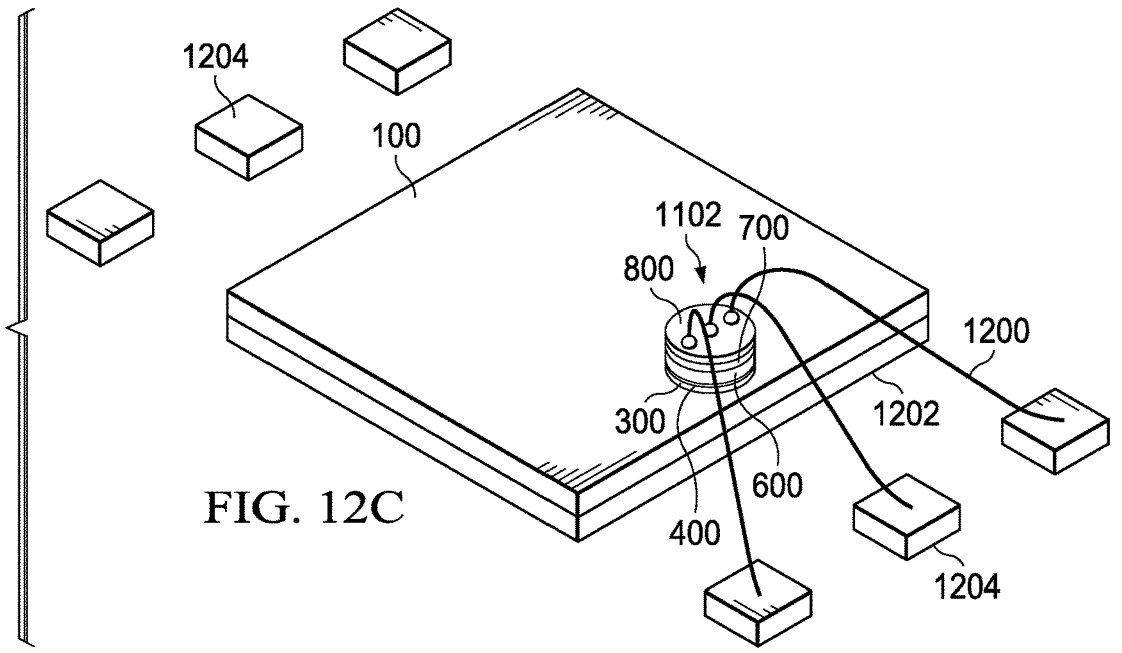

The method 1400 includes wirebonding the conductive member to a conductive terminal (e.g., a lead) (1426). FIG. 12A is a profile cross-sectional view of a bond wire 1200 coupled to the layer 800 of the conductive member 1102 and to a conductive terminal 1204. A die pad 1202 is coupled to the semiconductor die 1100. FIG. 12B is a top-down view of the structure of FIG. 12A. FIG. 12C is a perspective view of the structure of FIG. 12A.

The method 1400 includes applying a mold compound to cover the semiconductor die, the conductive member, the wirebond, and other structures (1428). FIG. 13A is a profile cross-sectional view of the structure of FIGS. 12A-12C, but with the application of a mold compound 1300, as shown. FIG. 13B is a top-down view of the structure of FIG. 13A. FIG. 13C is a perspective view of the structure of FIG. 13A.

Unless otherwise stated, "about," "approximately," or "substantially" preceding a value means +/−10 percent of the stated value. Modifications are possible in the described examples, and other examples are possible within the scope of the claims.

What is claimed is:

1. A semiconductor package, comprising:

a semiconductor die including a device side having a circuit formed therein;

a conductive member coupled to the circuit and having multiple layers, including:

a titanium tungsten layer coupled to the circuit;

a copper seed layer coupled to the titanium tungsten layer;

a copper layer coupled to the copper seed layer;

a nickel tungsten layer coupled to the copper layer; and a top layer coupled to the nickel tungsten layer;
a ball bond of a bond wire coupled to the top layer; and
a conductive terminal coupled to the bond wire, wherein the titanium tungsten layer and the top layer are not in direct contact.

2. The semiconductor package of claim 1, wherein the titanium tungsten layer has a thickness ranging from 1000 Angstroms to 5000 Angstroms.

3. The semiconductor package of claim 1, wherein a horizontal cross-sectional area of the conductive member does not vary by more than 10%.

4. The semiconductor package of claim 1, wherein a thickness of the nickel tungsten layer has a range from 0.5 microns to 1 micron.

5. The semiconductor package of claim 1, wherein the top layer is a silver layer having a thickness ranging from 0.5 microns to 1 micron.

6. The semiconductor package of claim 1, wherein the top layer is a gold layer having a thickness ranging from 0.1 microns to 0.5 microns.

7. The semiconductor package of claim 1, wherein the nickel tungsten layer has a composition by weight of 10-50% tungsten.

8. The semiconductor package of claim 1, wherein the titanium tungsten layer has a composition by weight of less than 99% tungsten and between 1-20% titanium.

9. A semiconductor package, comprising:
a semiconductor die including a device side having a circuit formed therein;
a conductive member coupled to the circuit and having multiple layers, including:
a titanium tungsten layer coupled to the circuit;
a copper layer in contact with the titanium tungsten layer;
a nickel tungsten layer in contact with the copper layer and having a thickness ranging from 0.5 microns to 1 micron; and
a gold layer in contact with the nickel tungsten layer and having a thickness ranging from 0.1 microns to 0.5 microns;
a ball bond of a bond wire coupled to the gold layer; and
a conductive terminal coupled to the bond wire, wherein the titanium tungsten layer and the gold layer are not in direct contact.

10. The semiconductor package of claim 9, wherein the nickel tungsten layer has a composition by weight of 15-20% tungsten.

11. The semiconductor package of claim 9, wherein the gold layer is in direct contact with the nickel tungsten layer.

12. The semiconductor package of claim 9, wherein a horizontal cross-sectional area of the conductive member does not vary by more than 10%.

13. A semiconductor package, comprising:
a semiconductor die including a device side having a circuit formed therein;
a conductive member coupled to the circuit and having multiple layers, including:
a titanium tungsten layer coupled to the circuit;
a copper seed layer in contact with the titanium tungsten layer;
a copper layer in contact with the copper seed layer;
a nickel tungsten layer in contact with the copper layer, the nickel tungsten layer having a thickness ranging from 0.5 microns to 1 micron and a composition by weight of 10-50% tungsten; and
a top layer in contact with the nickel tungsten layer, the top layer being either a silver layer having a thickness ranging from 0.5 microns to 1 micron or a gold layer having a thickness ranging from 0.1 microns to 0.5 microns;
a ball bond of a bond wire coupled to the top layer;
a mold compound covering the semiconductor die, the conductive member, and the bond wire; and
a conductive terminal coupled to the bond wire, wherein the titanium tungsten layer and the top layer are not in direct contact.

14. The semiconductor package of claim 13, wherein the titanium tungsten layer has a composition by weight of less than 99% tungsten and between 1-20% titanium.

15. The semiconductor package of claim 13, wherein a horizontal cross-sectional area of the conductive member does not vary by more than 10%.

* * * * *